US 6,750,513 B2

(12) United States Patent
Ohyanagi et al.

(10) Patent No.: US 6,750,513 B2
(45) Date of Patent: Jun. 15, 2004

(54) SEMICONDUCTOR DEVICE FOR DRIVING PLASMA DISPLAY PANEL

(75) Inventors: Takasumi Ohyanagi, Hitachi (JP); Atsuo Watanabe, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/393,951

(22) Filed: Mar. 24, 2003

(65) Prior Publication Data

US 2003/0160284 A1 Aug. 28, 2003

Related U.S. Application Data

(62) Division of application No. 10/101,162, filed on Mar. 20, 2002, now abandoned.

(30) Foreign Application Priority Data

Oct. 17, 2001 (JP) ........................................ 2001-318969

(51) Int. Cl.[7] ........................... H01L 27/01; H01L 27/12
(52) U.S. Cl. ...................... 257/347; 257/348; 257/409
(58) Field of Search ................................ 257/347, 348, 257/409

(56) References Cited

U.S. PATENT DOCUMENTS

| 5,640,040 A | | 6/1997 | Nakagawa | 257/487 |
|---|---|---|---|---|
| 5,654,561 A | * | 8/1997 | Watabe | 257/139 |
| 5,777,365 A | * | 7/1998 | Yamaguchi et al. | 257/347 |
| 6,307,224 B1 | * | 10/2001 | Shirai | 257/288 |
| 6,531,738 B1 | * | 3/2003 | Uemoto et al. | 257/347 |
| 2002/0030238 A1 | * | 3/2002 | Nakamura et al. | 257/409 |

FOREIGN PATENT DOCUMENTS

| JP | 8-181321 | | 7/1996 | |
|---|---|---|---|---|
| JP | 2001102586 A | * | 4/2001 | H01L/29/786 |

* cited by examiner

*Primary Examiner*—Allan R. Wilson
(74) *Attorney, Agent, or Firm*—Antonelli, Terry, Stout & Kraus, LLP

(57) ABSTRACT

An N-channel MOS field-effect transistor on an SOI substrate including a source electrode, drain and gate electrodes both disposed via a field oxide film, a gate oxide film, a high concentration P-type layer, a high concentration N-type layer contacting the source electrode and the gate oxide film, a high concentration N-type layer contacting the drain electrode, a p-body layer contacting the high concentration P-type and N-type layers and the gate oxide film. In this transistor, an N-type layer with a concentration higher than that of a drain region contacting the p-body layer constitutes a region covering at most 95% of the source-drain distance. Further, an N-type region having a concentration from $3 \times 10^{16}/cm^3$ to $1 \times 10^{22}/cm^3$ is provided near a buried oxide film under the drain electrode.

5 Claims, 17 Drawing Sheets

PROPORTION OF N-TYPE LAYER IN A REGION COVERING COLLECTOR-BASE DISTANCE

SEMICONDUCTOR DEVICE FOR DRIVING PLASMA DISPLAY PANEL

This is a division of application Ser. No. 10/101,162, filed Mar. 20, 2002 now abandoned, the entire disclosure of which is hereby incorporated by reference.

BACKGROUND OF THE INVENTION

The present invention relates to a semiconductor device and a method of manufacturing the semiconductor device. More specifically, the invention relates to an insulated-gate field-effect transistor and a bipolar transistor, both formed on an SOI substrate.

In a high breakdown voltage semiconductor device formed on the SOI (Silicon On Insulator) substrate, the magnitude of the breakdown voltage of the device determines the thickness of a silicon layer and the thickness of a buried insulating film. The silicon layer is the active region where the device is formed, and is formed over a support silicon substrate via the insulating film. The breakdown voltage of an N-channel insulated-gate field-effect transistor is herein defined as a voltage applied to a drain electrode therein when an electric current flowing through the drain electrode has become 10 $\mu$A through the application of the voltage to the drain electrode. In this case, the gate width of the field-effect transistor measured with an IWATSU semiconductor curve tracer TT-508 is 50 $\mu$m, and source and gate electrodes and the back of the SOI substrate where the device is formed are set at the ground level or 0 V. Alternatively, the breakdown voltage of a P-channel insulated-gate field-effect transistor is herein defined as a voltage applied to a source electrode or a gate electrode therein when a current flowing through the source electrode has become 10 $\mu$A through the application of voltages applied to both the source and gate electrodes. In this case, the gate width of the field-effect transistor measured with the above-mentioned curve tracer is 50 $\mu$A, and a drain electrode and the back of an SOI substrate is set at the ground level (0 V). Alternatively, the breakdown voltage of an NPN bipolar transistor is herein defined as a voltage applied to a collector electrode therein, or BVceo when a current flowing through the collector electrode has become 10 $\mu$A through the application of the voltage to the collector electrode. The emitter length of the bipolar transistor measured with the curve tracer is 50 $\mu$m in this case, and the base electrode is set to open, and an emitter electrode and the back of an SOI substrate are set at the ground level. Still alternatively, the breakdown voltage of a PNP bipolar transistor is herein defined as a voltage applied to an emitter electrode therein when a current flowing through the emitter electrode has become 10 $\mu$A through the application of the voltage applied to the emitter electrode. In this case, a collector electrode and the back of an SOI substrate is set at the ground level and a base electrode is set to open by the use of the above-mentioned curve tracer.

The thicker the silicon layer and the thicker the buried insulating film, a device with an increased breakdown voltage can be fabricated. However, when the buried insulating film becomes thick, a warp in a wafer increases in the manufacturing process of the device. Consequently, the process at the final stage in completion of the device cannot be performed. Further, the larger a wafer diameter, the more manifest this phenomenon becomes. In general, in the wafer with a diameter of 6, 8, or 12 inches, a silicon oxide film is now commonly employed as the buried insulating film. The maximum thickness of the buried insulating film is regarded as approximately 3 $\mu$m. For this reason, when a high breakdown voltage device is fabricated, it is necessary to increase the thickness of the silicon layer, which is the active region. However, if the thickness of the silicon layer is increased, it takes much time to form trenches required for isolation of a device-forming region. For this reason, throughput is reduced, so that a cost problem arises. In addition, it becomes difficult to form a completely vertical deep trench and cover the trench with an insulated film tightly.

FIGS. 2A and 2B show the structure of a high breakdown voltage N-channel MOS field-effect transistor and the structure of a high breakdown voltage NPN bipolar transistor, both using an SOI substrate with an N-type device-forming region and having a breakdown voltage of approximately 200 to 600 V, respectively.

FIG. 2A illustrates the N-channel MOS field-effect transistor formed on an SOI substrate 101 having an N-type region over a buried insulating film 103. The transistor comprises a high concentration N-type layer 402 and a high concentration p-type layer 401 both contacting a source electrode 201, a gate insulating film 301 and a gate electrode 302, a high concentration N-type layer 403, and a p-type semiconductor layer or a p-body layer 404. The gate insulating film 301 and the gate electrode 302 are in contact with the high concentration N-type layer 402. The high concentration N-type layer 403 is in contact with a drain 202 disposed in a lateral direction via a field oxide film 204 contacting the gate electrode. The p-body layer 404 is in contact with the gate oxide film, and the high concentration N-type and P-type layers contacting the source electrode. As a drain region interposed between the p-body layer and the drain electrode, the N-type substrate is usually employed without alteration. Alternatively the concentration of the drain region may be adjusted by ion implantation and diffusion of phosphorus ions, for example. An n-type layer formed by implantation and diffusion of ions of an element such as phosphorus into the substrate is hereinafter referred to as a WELL and the concentration of the resulting layer is referred to as a WELL concentration.

FIG. 2B illustrates the NPN bipolar transistor formed on the SOI substrate 101 having the N-type region over the buried insulating film 103. The transistor comprises a collector electrode 205, an emitter electrode 207 and a base electrode 206 disposed via the field oxide film 204, high-concentration N-type layers 411 and 413, a high concentration P-type layer 412, and a P-type base region 414. The high-concentration N-type layer 411 is in contact with the collector electrode. The high concentration N-type layer 413 is in contact with the emitter electrode 207. The high concentration P-type layer 412 is in contact with the base electrode. The p-type base region 414 is in contact with the high concentration N-type layer contacting the emitter electrode and the high concentration P-type layer contacting the base electrode. As a collector region interposed between the p-type base region and the collector electrode, the n-type substrate is usually employed without alteration, or the WELL is formed for use as the collector region. The NPN bipolar transistor is usually what is called a vertical structure with a high concentration N-type layer brought into contact with the buried insulation film. However, the present invention has been made to reduce the thickness of the silicon layer. Accordingly, if the high concentration N-type layer is present in the silicon layer with its thickness reduced, a high breakdown voltage cannot be obtained. Thus, a lateral structure in which the high concentration N-type layer contacting the buried insulating film has been solely removed from the conventional vertical structure is herein defined as a conventional structure.

Now, a mechanism whereby a breakdown voltage is determined will be described. In the case of the N-channel MOS field-effect transistor illustrated in FIG. 2A, when a voltage is applied to the drain electrode, a depletion layer formed between the p-body layer and the N-type substrate is extending. In addition, a depletion layer is extending from the vicinity of the buried insulating film under the drain electrode as well. If a drain-source distance is short, a rise in the electric field of the depletion layer formed between the p-body layer and the N-type substrate becomes faster than a rise in the electric field of the depletion layer formed in the vicinity of the buried insulating film. If the drain-source distance becomes long, the depletion layer between the p-body layer and the N-type substrate can extend sufficiently large. Accordingly, a rise in the electrical field of the depletion layer formed in the vicinity of the buried insulating film becomes faster than a rise in the electric field of the depletion layer formed between the p-body layer and the N-type substrate. The drain-source distance is affected by the concentration of the substrate as well. When the concentration of the substrate becomes high, even if the drain-source distance is increased, the depletion layer formed between the p-body layer and the N-type substrate cannot extend sufficiently large. Thus, the breakdown voltage is determined from the depletion layer between the p-body layer and the N-type substrate. Suppose selection of the concentration of the substrate is performed so that the breakdown voltage is determined from the extension of the depletion layer formed in the vicinity of the buried insulating film. Then, the maximum breakdown voltage of the device with a given silicon layer thickness and a given buried-insulating-film thickness can be obtained.

In the case of the NPN bipolar transistor illustrated in FIG. 2B as well, the breakdown voltage is determined either from the electric field of the depletion layer formed between the P-type base layer and the N-type substrate or the electric field of the depletion layer that extends from the buried insulating film immediately under the collector electrode, as in the case of the N-channel MOS field-effect transistor. In the case of the NPN bipolar transistor as well, by selecting the concentration of the substrate such that the breakdown voltage is determined from the extension of the depletion layer from the vicinity of the buried insulating film, the breakdown voltage can be maximized.

When an N-channel MOS field-effect transistor having the conventional structure is formed on the SOI substrate including a 1.5-$\mu$m thick silicon layer and a 3.0-$\mu$m thick silicon oxide film employed as the buried insulating film, the breakdown voltage of the device becomes 275 V according to a computer simulation. Thus, it becomes impossible to achieve the breakdown voltage of 300 V. For this reason, if the N-channel MOS field-effect transistor with the breakdown voltage of 300 V is desired, there is no way other than increasing the thickness of the silicon layer or the thickness of the buried oxide film.

However, in the case of an 8-inch SOI substrate, for example, when the thickness of the buried oxide film exceeds 3.0 $\mu$m, a warp in the wafer increases during the manufacturing process of the device, so that manufacture of the device cannot be completed.

Even when the thickness of the buried oxide film is 3.0 $\mu$m as well, in order to reduce a warp on the wafer in the initial state, a thick oxide film with a thickness of 2.0 $\mu$m or more should be formed over the region of the SOI substrate surface that is not the device-forming region, at the purchase of the wafer. Then, during the device manufacturing process as well, care should be taken so as not to reduce the thickness of the oxide film as much as possible. Accordingly, a reduction in the thickness of the buried oxide film is desired. On the other hand, when the thickness of the silicon layer becomes thick, it takes additional time to form the trenches for device isolation. Thus, throughput is reduced, and it also becomes difficult to form a vertical deep trench and cover the trench with an insulating film tightly. For this reason, a reduction in the thickness of the silicon layer is also desired.

SUMMARY OF THE INVENTION

The present invention has been made in view of the problems described above. It is therefore an, object of the present invention to provide an increased breakdown voltage semiconductor device and the method of manufacturing the increased breakdown voltage semiconductor device without increasing the thickness of a silicon layer that is a device active region. The semiconductor device according to the present invention comprises either an insulated-gate field-effect transistor and a bipolar transistor, both having an increased breakdown voltage.

As an attempt to increase the breakdown voltage of a semiconductor device on an SOI substrate, there is provided an invention, as described in JP-A-08-181321, that aims at improvement in the breakdown voltage by forming an N-type high concentration layer near a buried insulating film. However, suppose a semiconductor device on a thin SOI substrate including a silicon layer having a thickness of approximately 2 $\mu$m or less, as suggested by the present invention. If the N-channel MOS field-effect transistor illustrated in FIG. 2A is taken as an example, the depletion layer between the p-body layer and the N-type substrate comes in contact with the N-type high concentration layer near the buried oxide film. Thus, the breakdown voltage of the device is not increased. On the contrary, it is reduced. Likewise, even in the NPN bipolar transistor illustrated in FIG. 2B, the depletion layer between the p-base layer and the N-type substrate comes into contact with the N-type high concentration layer near the buried oxide film, the breakdown voltage of the device is not increased. On the contrary, it is reduced.

There is also provided an invention disclosed in FIG. 157 in U.S. Pat. No. 5,640,040 which aims at an improvement in the breakdown voltage by forming an N-type layer under a cathode. However, on the SOI substrate with the 1.5-$\mu$m thick silicon layer and the 3.0-$\mu$m thick buried oxide film, suggested by the present invention, the structure according to this U.S. patent cannot achieve the breakdown voltage of 300 V.

In order to solve the problems described above, an N-channel MOS field-effect transistor according to a first aspect of the invention comprises an N-type region having a concentration higher than the concentration of a region contacting a p-body layer. The N-type region constitutes a region covering at most 95% of the distance from the end of a source region to the end of a drain region. The N-type region is in contact with a high concentration N-type layer contacting a drain electrode and extends toward a high concentration N-type layer in contact with a source electrode. The end of the source region is herein defined as the end of a gate oxide film contacting the high concentration N-type layer in contact with the source electrode. The end of the drain region is herein defined as the end of a field oxide film contacting the high concentration N-type layer in contact with the drain electrode.

An NPN bipolar transistor according to the first aspect of the present invention also comprises an N-type region having a concentration higher than the concentration of a region contacting a P-type base region. The N-type region constitutes a region covering at most 95% of the distance from the end of a collector region to the end of a base region. The N-type region is in contact with a high concentration N-type layer contacting a collector electrode and extends toward the base region. The end of the collector region is herein defined as the end of a field oxide film in contact with the high concentration N-type layer contacting the collector electrode. The end of the base region is herein defined as the end of the filed oxide film contacting the base region.

There are two types of mechanisms whereby the breakdown voltage of a semiconductor device formed on the SOI substrate having an N-type device-forming region is determined. In the above-mentioned N-channel MOS field-effect transistor, for example, the breakdown voltage is determined from an electric field resulting from extension of a depletion layer formed between the p-body layer and the substrate. Alternatively, the breakdown voltage is determined from an electric field resulting from extension of a depletion layer formed in the vicinity of the buried insulating film. The concentration of the substrate or WELL concentration determines which one of the mechanisms is employed. More specifically, when the concentration of the substrate is low, the depletion layer formed between the-p-body layer and the N-type substrate can extend sufficiently large. For this reason, a rise in the electric field of the depletion layer formed in the vicinity of the buried oxide film becomes faster than a rise in the electric field of this depletion layer. A critical voltage is thus reached faster in the electric field of the depletion layer in the vicinity of the buried oxide film. However, when the concentration of the substrate becomes high, the depletion layer formed between the p-body layer and the N-type substrate cannot extend sufficiently large. Thus, the critical voltage is reached faster in the electric field of the depletion layer between the p-body layer and the N-type substrate than the electric field of the depletion layer formed in the vicinity of the buried insulating film.

However, when a voltage close to the breakdown voltage is applied to the N-type MOS field-effect transistor illustrated in FIG. 2A, the N-type layer excluding the p-body layer becomes fully depleted, so that it can be regarded as a single capacitor. Its capacitance is denoted Csi. The buried insulating film, for which a silicon oxide film is employed in many cases, has also a capacitance as a matter of course. This capacitance is denoted Cox. Then, when the voltage close to the breakdown voltage is applied, the SIO substrate can be modeled as a series connection of the capacitors of Csi and Cox. Usually, a support substrate under the buried oxide film also has a capacitance. However, in a computer simulation employed for the present invention, the support substrate is regarded as a complete conductor, and approximations are made on the basis of this assumption. Further, modeling is performed such that the potential of the interface of the support substrate contacting the buried oxide film is set to the ground potential. Thus, the capacitance of the support substrate is ignored in this modeling process as well. When a voltage V is applied to the drain electrode, the applied voltage V is divided between the silicon substrate and the buried oxide film according to the ratio between the capacitance Csi and the capacitance Cox. The voltage applied to the buried oxide film when the voltage V is applied to the drain electrode can be expressed as $(Csi \times V)/(Csi+Cox)$. The larger Csi becomes, the larger the voltage applied to the buried oxide film can be made. Consequently, the voltage applied to the silicon substrate is accordingly reduced. The breakdown voltage of the device is thus improved. Setting the Csi to be large or setting the concentration of the substrate to be high can increase the voltage applied to the buried oxide film. The breakdown voltage of the device is thereby improved.

The excessively high concentration of the substrate, however, does not allow the depletion layer formed between the p-body layer and the N-type substrate to extend sufficiently large. For this reason, the breakdown voltage of the device is determined from the depletion layer formed between the p-body layer and the N-type substrate. Consequently, the breakdown voltage is not improved. On the contrary, it is reduced. Accordingly, provided that the depletion layer formed between the p-body layer and the N-type substrate can be extended sufficiently large, the increased concentration of the substrate can provide a higher breakdown voltage. Hence, if a voltage applied to the buried oxide film can be increased or the concentration of the substrate can be increased while the depletion layer formed between the p-body layer and the N-type substrate is extended sufficiently large, the breakdown voltage of the device can be improved without increasing the thickness of the silicon layer.

The first feature of the present invention is that the substrate concentration of a region between the p-body layer and the N-type substrate, where the depletion layer is formed, is set to be low, and that the concentration of other region is set to be higher than the substrate concentration. The breakdown voltage of the device is not thereby determined from extension of the depletion layer between the p-body layer and the N-type layer, but is determined from extension of the depletion layer formed in the vicinity of the buried oxide layer. With this arrangement, the concentration of the substrate other than a region near the p-body layer can be made higher than that in the conventional structure. Thus, a voltage applied to the buried oxide film is increased, which results in an improvement in the breakdown voltage.

FIG. 3 shows the breakdown voltage obtained when the proportion of the N-type layer formed in the structure of the NPN bipolar transistor according to the present invention is changed relative to a collector-base distance. This structure is formed on the SOI substrate including the 1.5-µm thick silicon layer and a 0.5-µm thick buried oxide film, and the concentration of the substrate is $5 \times 10^{15}/cm^3$. Formation of the N-type layer having a concentration higher than the concentration of the substrate, which is the feature of the present invention, starts from the end of the collector region. In the conventional NPN transistor structure, when the concentration of the substrate is $5 \times 10^{15}/cm^3$, the breakdown voltage is 95 V, according to the computer simulation. Suppose that the present invention is applied to the NPN bipolar transistor having the concentration of the substrate of $5 \times 10^{15}/cm^3$. If the proportion of the formed N-type layer exceeds 0% of the emitter-base distance or if any N-type region with a concentration higher than the concentration of the substrate is present, the effect of the present invention can be obtained. The effect brings about an increase in the breakdown voltage of approximately 30 V at the maximum. The breakdown voltage becomes as large as 125 V at the maximum. The effect can be obtained until the proportion of the N-type layer with the concentration higher than the concentration of the substrate reaches 95% of the collector-base distance.

In an N-channel MOS field-effect transistor according to a second aspect of the present invention, the concentration of an N-type layer in contact with a buried insulating film under a drain electrode is set to be from $3 \times 10^{16}/cm^3$ to $1 \times 10^{22}/cm^3$. In an NPN bipolar transistor, the concentration of an N-type layer in contact with a buried insulating film under a collector electrode is set to be from $3 \times 10^{16}/cm^3$ to $1 \times 10^{22}/cm^3$.

With this arrangement, in the N-channel MOS field-effect transistor, a depletion layer from the buried insulating film under the drain electrode does not extend, so that a voltage input to the drain electrode is all applied to the buried insulating film. Consequently, the breakdown voltage of the device is more improved than in the conventional structure. Incidentally, phosphorus and arsenic-are suitable for making the concentration of the N-type layer to be from $3 \times 10^{16}/cm^3$ to $1 \times 10^{22}/cm^3$. A CAMECA secondary ion mass spectrometer (SIMS) IMS-6F is employed for identification of the concentration, and Cs+ ions are used as primary ions.

There will be many cases where the concentration is used for describing the features of the present invention. The SIMS system described above will be employed for identification of the concentration in a region.

In a P-channel MOS field-effect transistor formed on an SOI substrate having an N-type device-forming region as well, on the other hand, the same effect as that according to the second aspect of the present invention can be obtained. In the P-channel MOS field-effect transistor, a voltage is usually applied to a source electrode. For this reason, a depletion layer extends from the vicinity of a buried insulating film under the source electrode. The breakdown voltage determined from this depletion layer takes on a maximum value. Accordingly, if an N-type layer with a concentration ranging from $3 \times 10^{16}/cm^3$ to $1 \times 10^{22}/cm^3$ is formed in the vicinity of the buried insulating film under the source electrode, depletion does not occur from there. Thus, a voltage input to the source electrode is all applied to the buried insulating film, so that the breakdown voltage is improved.

In a PNP bipolar transistor as well, if an N-type layer with a concentration ranging from $3 \times 10^{16}/cm^3$ to $1 \times 10^{22}/cm^3$ is formed under a base region, the breakdown voltage is improved.

According to the first aspect of the present invention, a region covering at most 95% of the source-drain distance is set to the N-type layer having a concentration higher than the concentration of the substrate. According to the second aspect of the present invention, the concentration of the N-type layer in contact with the buried insulating film under the drain electrode is set to be from $3 \times 10^{16}/cm^3$ to $1 \times 10^{22}/cm^3$. In the N-channel MOS field-effect transistor according to the present invention, combination of the first aspect of the present invention and the second aspect of the present invention is possible as a matter of course. Then, the breakdown voltage of the device is further improved. In the NPN bipolar transistor according to the present invention as well, combination is also possible.

Incidentally, as a result of combination of the first and second aspects of the present invention, in the N-channel MOS field-effect transistor formed on the SOI substrate having the 1.5-μm thick silicon layer and the 3.0-μm thick buried oxide film, the breakdown voltage of 340 V was obtained. This voltage value is obtained as the result of the computer simulation.

Herein, a description was directed to both of the cases where the SOI substrate with the 1.5-μm thick silicon layer has the 0.5-μm thick buried oxide film and the 3.0-μm buried oxide film. In both of the cases, the effect of the improved breakdown voltage was obtained. As a matter of course, the thickness of the silicon layer may be set to any value more or less than 1.5 μm. Similarly, the thickness of the buried oxide film may also be set to any value. The effect of the improved breakdown voltage can be obtained irrespective of the thickness of the silicon layer and the thickness of the buried oxide film.

According to the present invention, an increased breakdown voltage N-channel MOS field-effect transistor, an increased breakdown voltage P-channel MOS field-effect transistor, an increased breakdown voltage NPN transistor, and an increased breakdown voltage PNP transistor can be obtained without increasing the thickness of a silicon layer and the thickness of a buried oxide film.

Other objects, features and advantages of the invention will become apparent-from the following description of the embodiments of the invention taken in conjunction with the accompanying drawings.

DESCRIPTIOIN OF THE EMBODIMENTS

Now, embodiments of a semiconductor device according to the present invention will be described with reference to FIG. 1 and FIGS. 4 to 10. Embodiments of a method of manufacturing the semiconductor device will be described with reference to FIGS. 11 to 14. Then, applications of the present invention will be described with reference to FIGS. 15 to 17.

Figure 1:
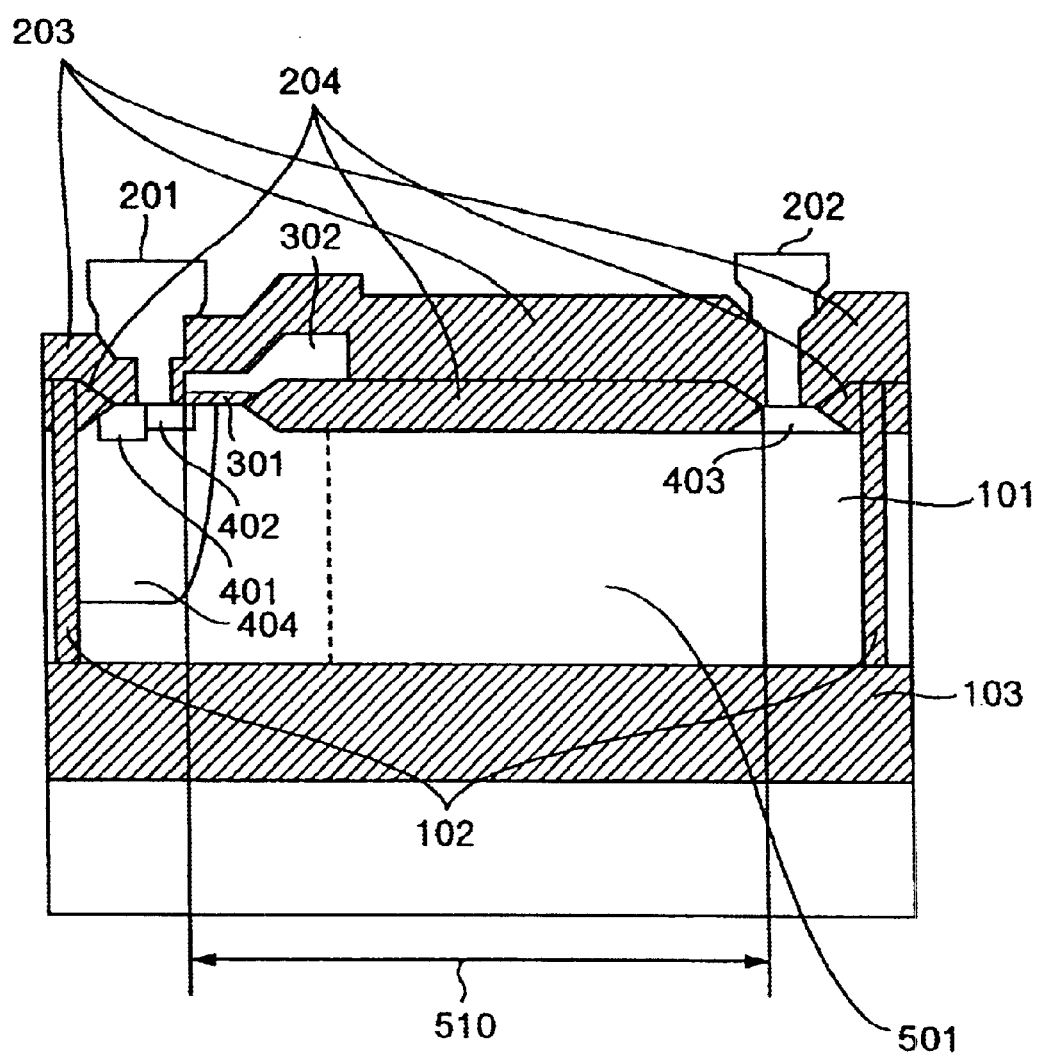
FIG. 1 is a vertical sectional view showing the structure of an N-channel MOS field-effect transistor according to a first embodiment of the present invention.
Figure 2A:
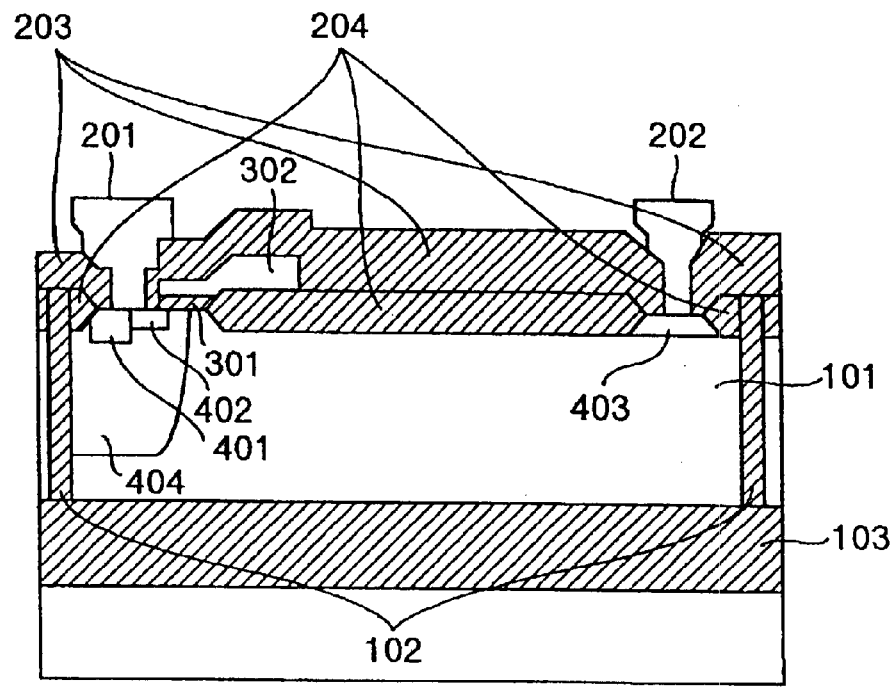
FIGS. 2A and 2B are vertical sectional views respectively showing the structures of a conventional N-channel MOS field-effect transistor and a conventional NPN bipolar transistor.
Figure 2B:
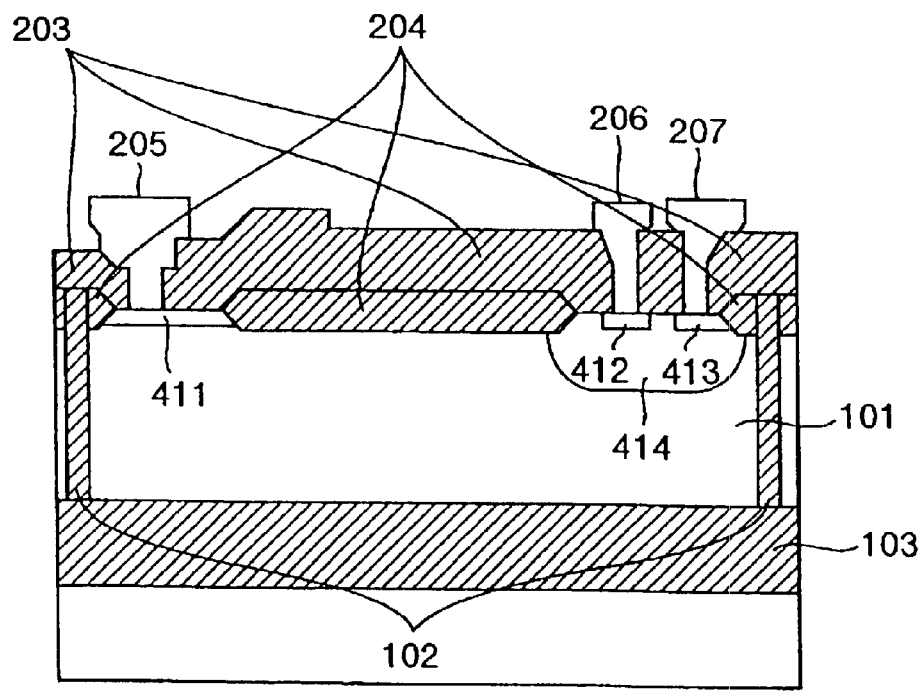
Figure 3:
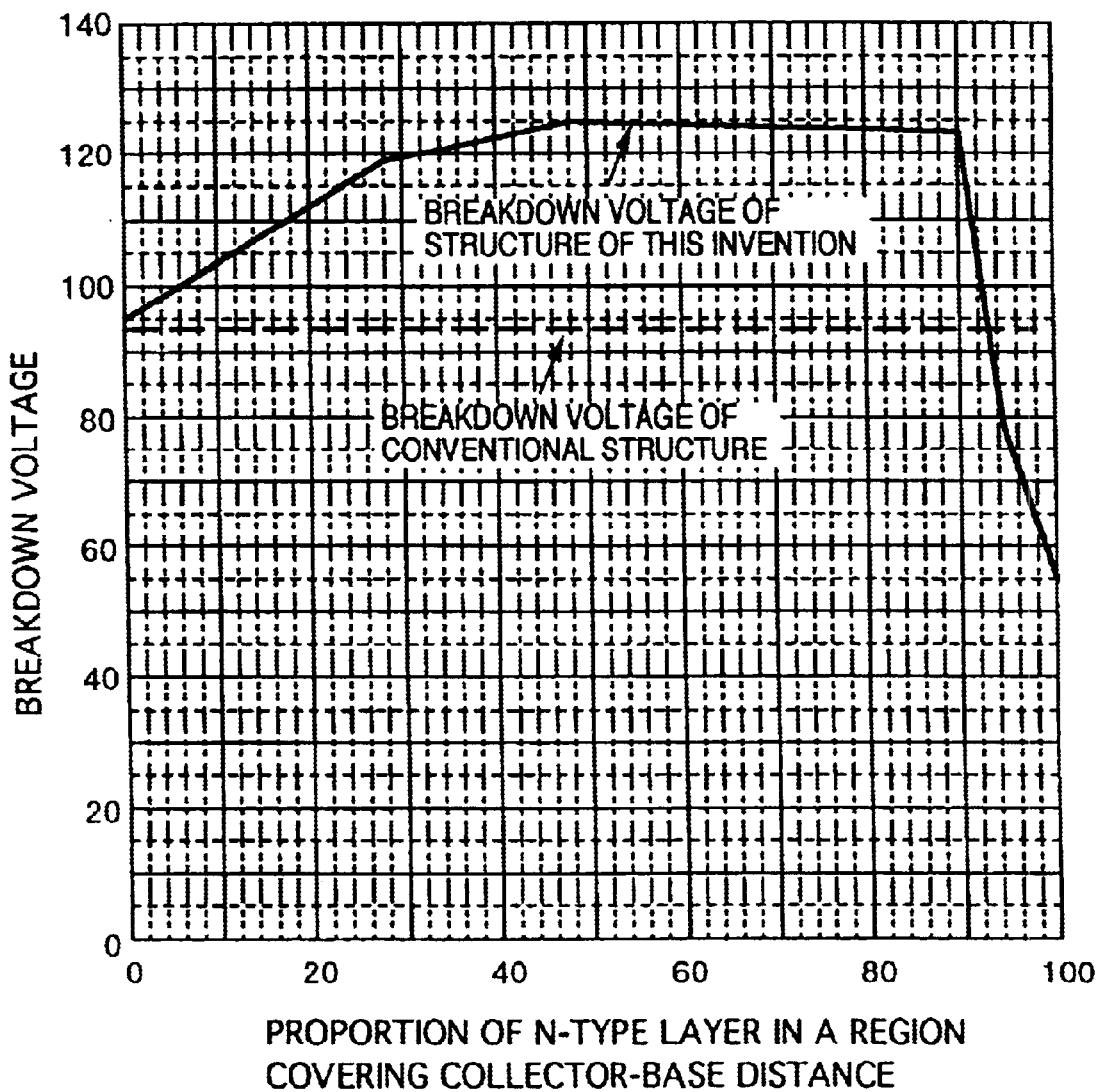
FIG. 3 is a graph showing the result of a simulation of a breakdown voltage of an NPN bipolar transistor formed on an SOI substrate having a 1.5-μm thick silicon layer and a 0.5-μm buried oxide film.

First, FIG. 1 shows a semiconductor device according to a first embodiment of the present invention, and is a vertical sectional view illustrating the structure of an N-channel MOS field-effect transistor. The N-channel MOS field-effect transistor comprises the source electrode 201, and the drain electrode 202 and gate electrode 302 disposed in a lateral direction via the field oxide film 204, on the SOI substrate 101 having the N-type device-forming region. The transistor further comprises the gate oxide film 301, high concentration P-type layer 401, high concentration N-type layer 402, high concentration N-type layer 403, and p-type layer or p-body layer 404. The gate oxide film 301 is in contact with the gate electrode 302. The high concentration P-type layer 401 is in contact with the source electrode 201, and the high concentration N-type layer 402 is in contact with the source electrode 201 and the gate oxide film 301. The high concentration N-type layer 403 is in contact with the drain electrode 202, and the p-body layer 404 is in contact with the high concentration P-type layer 401, high concentration N-type layer 402, and gate oxide film 301. This transistor is characterized in that an N-type layer 501 constitutes a region covering at most 95% of a distance 510 from the end of the field oxide film to the ends of the gate electrode 302 and the gate insulating film 301. This transistor is also characterized in that the concentration of the N-type layer 501 is higher than the concentration of a drain region in contact with the p-body layer.

Suppose the conventional N-channel MOS field-effect transistor formed on the SOI substrate in which the thickness of the silicon layer, that is the device-forming region, is less than approximately 2 $\mu$m. When the concentration of the substrate or WELL concentration in this transistor is from $1\times10^{15}/cm^3$ to $1\times10^{16}/cm^3$, the breakdown voltage of the device will become a maximum. If the concentration is increased to be higher than $1\times10^{16}/cm^3$, the rise of the electric field of a depletion layer formed between the p-body layer 404 and the N-type substrate 101 occurs faster, so that an undesirable breakdown voltage is obtained. Since the concentration of the substrate that increases the breakdown voltage varies with the thickness of the silicon layer, the concentration of the substrate runs in the range described above. Suppose the case where the thickness of the silicon layer in the SOI substrate, which is the device-forming region, is 1.5 $\mu$m, and the thickness of a buried oxidation layer is 0.5 $\mu$m, for example. Then, if the concentration of the substrate is $1\times10^{16}/cm^3$ or lower, the depletion layer between the p-body layer and the N-type substrate can extend sufficiently large according to the computational simulation of the device. Accordingly, if the concentration of part of the N-type layer contacting the p-body layer is set to be $1\times10^{16}/cm^3$ or lower in the N-channel MOS field-effect transistor according to this embodiment, the depletion layer formed between the N-type substrate and the p-body layer can extend sufficiently large. If the concentration of the N-type layer 501 is set to be higher the concentration of part of the N-type layer contacting the p-body layer at this point, the effect of sufficiently large extension of the depletion layer can be obtained. Consequently, a voltage higher than that in the conventional art can be applied to the buried oxide film, so that the improved breakdown voltage can be obtained. The upper limit of the concentration in the N-type layer 501 is approximately $1\times10^{17}/cm^3$.

Figure 4:
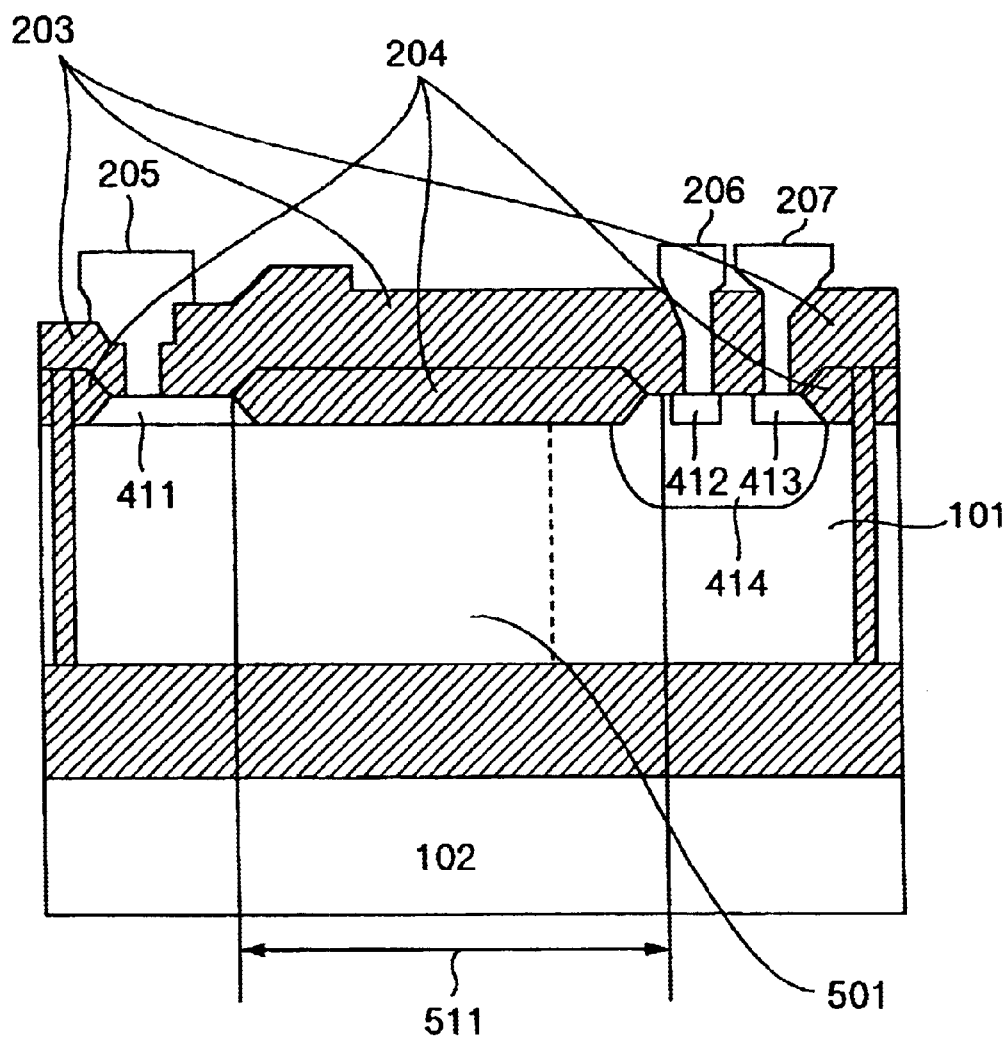
FIG. 4 is a vertical sectional view showing the structure of an NPN bipolar transistor according to a second embodiment of the present invention.

FIG. 4 shows a semiconductor device according to a second embodiment of the present invention, and is a vertical sectional view illustrating the structure of an NPN bipolar transistor. The NPN bipolar transistor comprises the collector electrode 205, and the base electrode 206 and the emitter electrode 207 disposed in the lateral direction via the field oxide film 204, on the SOI substrate 101 having the N-type device-forming region. The transistor further comprises the high concentration N-type layer 411, high concentration P-type layer 412, high concentration N-type layer 413, and p-type base layer 414. The high concentration N-type layer 411 is in contact with the collector electrode 205. The high concentration P-type layer 412 is in contact with the base electrode 206. The high concentration N-type layer 413 is in contact with the emitter electrode 207. The P-type base layer 414 is in contact with the high concentration p-type layer 412 and the high concentration N-type layer 413. This transistor is characterized in that the N-type layer 501 constitutes a region covering at most 95% of a distance 511 from the end of the field oxide film in contact with the high concentration N-type layer 411 contacting the collector electrode 205 to the end of the field oxide film in contact with the p-type base layer. This transistor is also characterized in that the concentration of the N-type layer 501 is higher than the concentration of a collector region contacting the p-base layer.

Suppose the conventional NPN bipolar transistor formed on the SOI substrate in which the thickness of the silicon layer, that is the device-forming region, is less than approximately 2 $\mu$m. When the concentration of the substrate or WELL concentration is from $1\times10^{15}/cm^3$ to $1\times10^{16}/cm^3$, the breakdown voltage of the device will become a maximum. If the concentration is increased to be higher than $1\times10^{16}/cm^3$, the rise of the electric field of a depletion layer formed between the p-type base layer and the N-type substrate occurs faster, so that an undesirable breakdown voltage is obtained. Accordingly, in the NPN bipolar transistor, if the concentration of the N-type layer in contact with the p-type base layer is set to $1\times10^{16}/cm^3$ or lower, the depletion layer formed between the p-type base layer and the N-type substrate can extend sufficiently large. If the concentration of the N-type layer 501 is set to be higher than the concentration of part of the N-type layer contacting the P-type base layer, the effect of extension of the depletion layer can be obtained. Consequently, a voltage higher than that in the conventional art can be applied to the buried oxide film, so that the improved breakdown voltage can be obtained. The upper limit of the concentration of the N-type layer 501 is approximately $1 \times 10^{17}/cm^3$.

Figure 5:
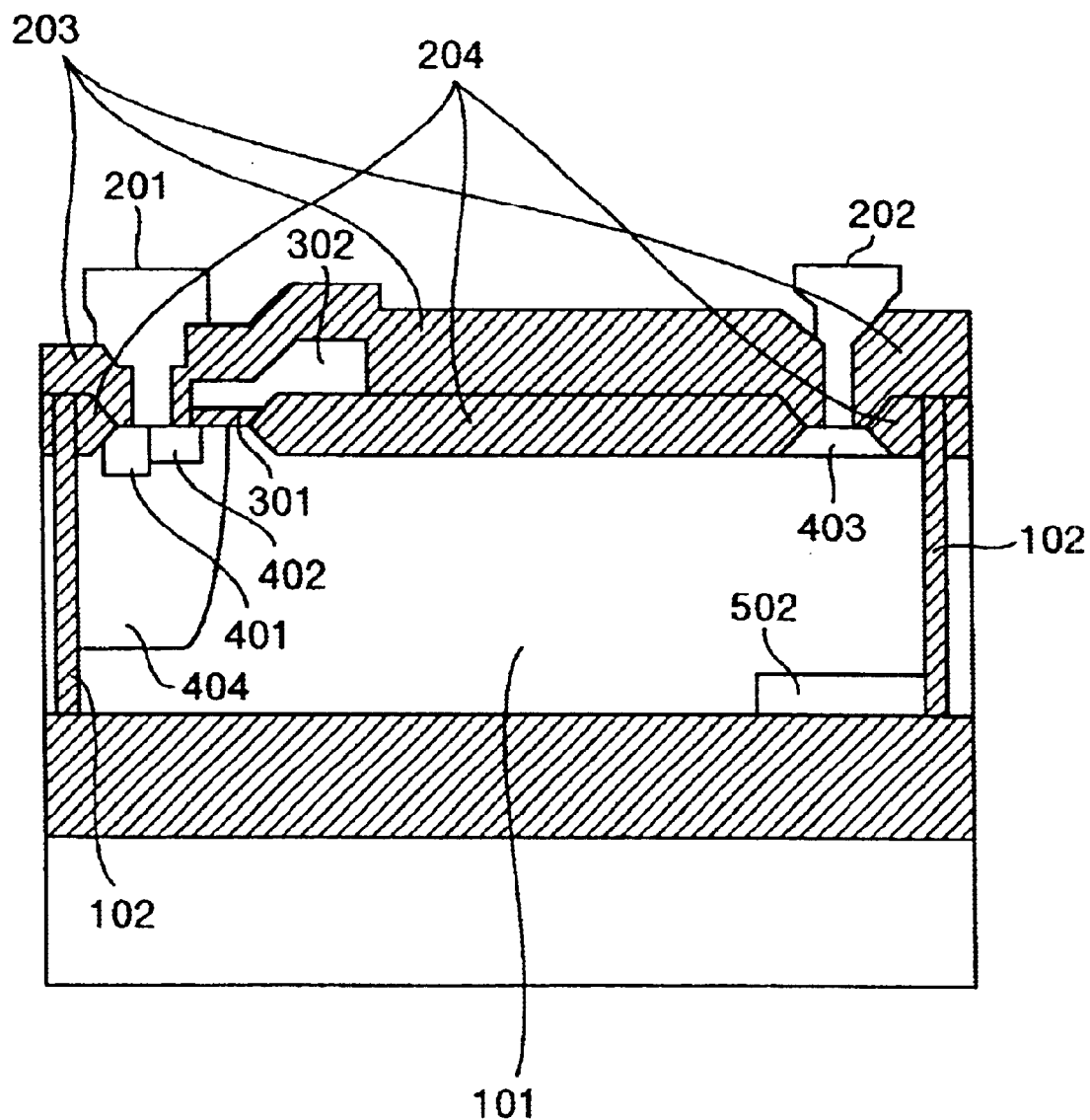
FIG. 5 is a vertical sectional view showing the structure of an N-channel MOS field-effect transistor according to a third embodiment of the present invention.

FIG. 5 shows a semiconductor device according to a third embodiment of the present invention, and is a vertical sectional view illustrating an N-channel MOS field-effect transistor. The N-channel MOS field-effect transistor comprises the source electrode 201, and the drain electrode 202 and the gate electrode 302 disposed in the lateral direction via the field oxide film 204, on the SOI substrate having the N-type device-forming region. The transistor further comprises the gate oxide film 301 in contact with the gate electrode 302, high concentration P-type layer 401, high concentration N-type layer 402, high concentration N-type layer 403, and p-type layer or p-body layer 404. The high concentration P-type layer 401 is in contact with the source electrode 201. The high concentration N-type layer 402 is in contact with the source electrode 201 and the gate oxide film 301. The high concentration N-type layer 403 is in contact with the drain electrode 202. The p-body layer 404 is in contact with the high concentration p-type layer 401, high concentration N-type layer 402, and gate oxide film 301. This transistor is characterized by further comprising an N-type layer 502. The N-type layer 502 is located immediately under the high concentration N-type layer 403 contacting the drain electrode 202, and in contact with a buried oxide film. The concentration of the N-type layer 502 is from $3 \times 10^{16}/cm^3$ to $1 \times 10^{22}/cm^3$.

In the conventional N-channel MOS field-effect transistor on the SOI substrate, when the concentration of the substrate is from $1 \times 10^{15}/cm^3$ to $1 \times 10^{16}/cm^3$, the breakdown voltage of the device will become a maximum. This breakdown voltage is determined from the vicinity of the buried oxide film under the drain electrode. This is because a depletion layer extends from the vicinity of the buried oxide film under the drain electrode, so that the rise of the electrical field there occurs. In this embodiment, however, the concentration of the N-type layer in the vicinity of the buried oxide film is set to be from $3 \times 10^{16}/cm^3$ to $1 \times 10^{22}/cm^3$. With this arrangement, the depletion layer will not extend from the vicinity of the buried oxide film under the drain electrode. Consequently, under the drain electrode, a voltage input to the drain electrode is all applied to the drain electrode, so that the increased breakdown voltage is obtained.

Figure 6:
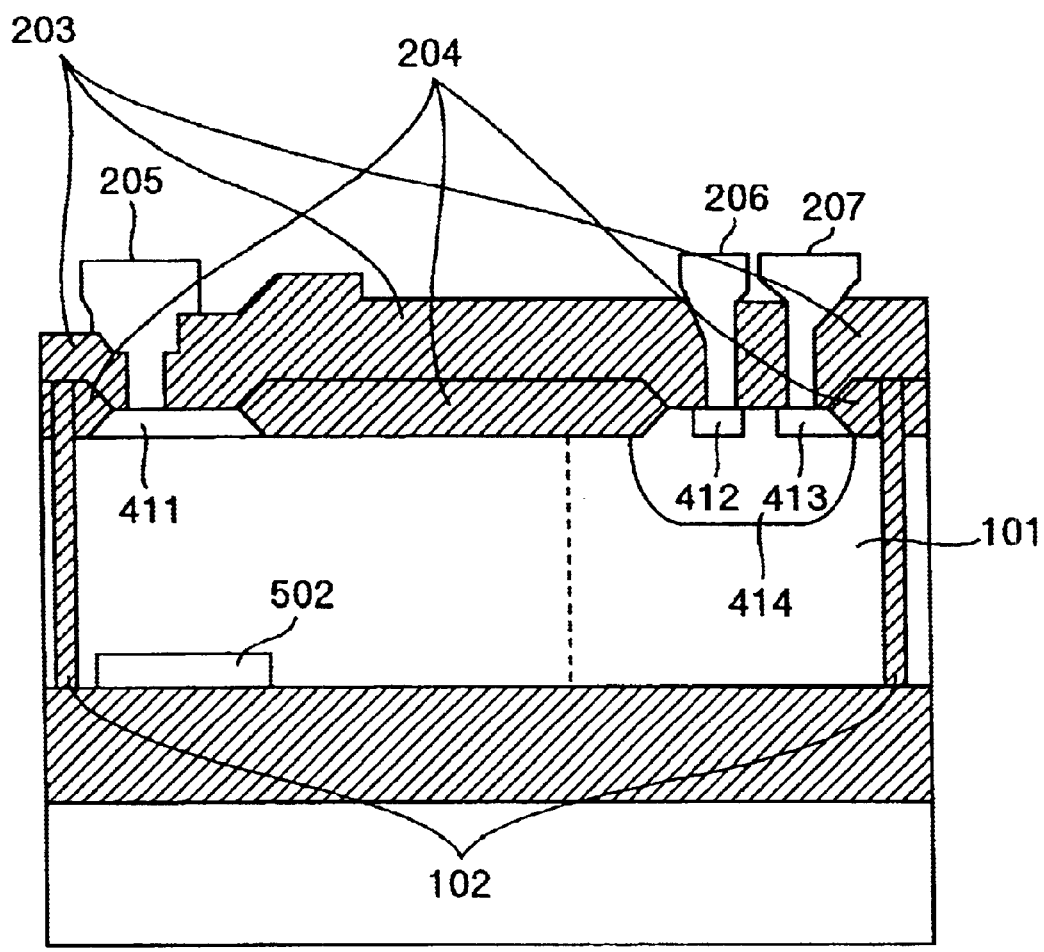
FIG. 6 is a vertical sectional view showing the structure of an NPN bipolar transistor according to a fourth embodiment of the present invention.

FIG. 6 shows a semiconductor device according to a fourth embodiment of the present invention, and is a vertical sectional view illustrating the structure of an NPN bipolar transistor. The NPN bipolar transistor comprises the collector electrode 205, and the base electrode 206 and the emitter electrode 207 disposed in the lateral direction via the field oxide film 204, on the SOI substrate 101 having the N-type device-forming region. The transistor further comprises the high concentration N-type layer 411, high concentration P-type layer 412, high concentration N-type layer 413, and P-type base layer 414. The high concentration N-type layer 411 is in contact with the collector electrode 205. The high concentration P-type layer 412 is in contact with the base electrode 206. The high concentration N-type layer 413 is in contact with the emitter electrode 207. The P-type base layer 414 is in contact with the high concentration P-type layer 412 and the high concentration N-type layer 413. The NPN bipolar transistor is characterized by further comprising the N-type layer 502. The N-type layer 502 is located immediately under the high concentration N-type layer 411 contacting the collector electrode 205, and in contact with the buried oxide film. The concentration of the N-type layer 502 is from $3 \times 10^{16}/cm^3$ to $1 \times 10^{22}/cm^3$.

In the conventional NPN bipolar transistor formed on the SOI substrate, when the concentration of the substrate or WELL concentration is from $1 \times 10^{15}/cm^3$ to $1 \times 10^{16}/cm^3$, the breakdown voltage of the device will become a maximum. This breakdown voltage is determined from the vicinity of the buried oxide film under the collector electrode. This is because a depletion layer extends from the vicinity of the buried oxide film under the collector electrode, so that the rise of the electrical field there occurs. In this embodiment, however, the concentration of the N-type layer in the vicinity of the buried oxide film is set to be from $3 \times 10^{16}/cm^3$ to $1 \times 10^{22}/cm^3$. With this arrangement, the depletion layer will not extend from the vicinity of the buried oxide film under the collector electrode. Consequently, under the collector electrode, a voltage input to the collector electrode is all applied to the buried oxide film, so that the increased breakdown voltage is obtained.

Figure 7A:
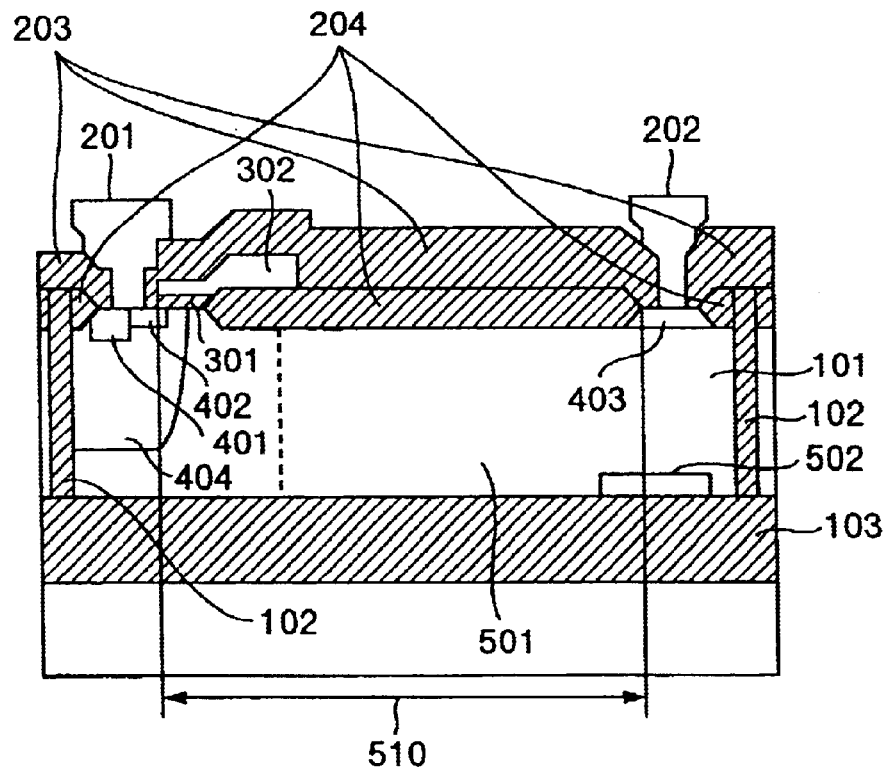
FIGS. 7A and 7B are vertical sectional views respectively showing the structures of an N-channel MOS field-effect transistor and an NPN bipolar transistor according to a fifth embodiment of the present invention.
Figure 7B:
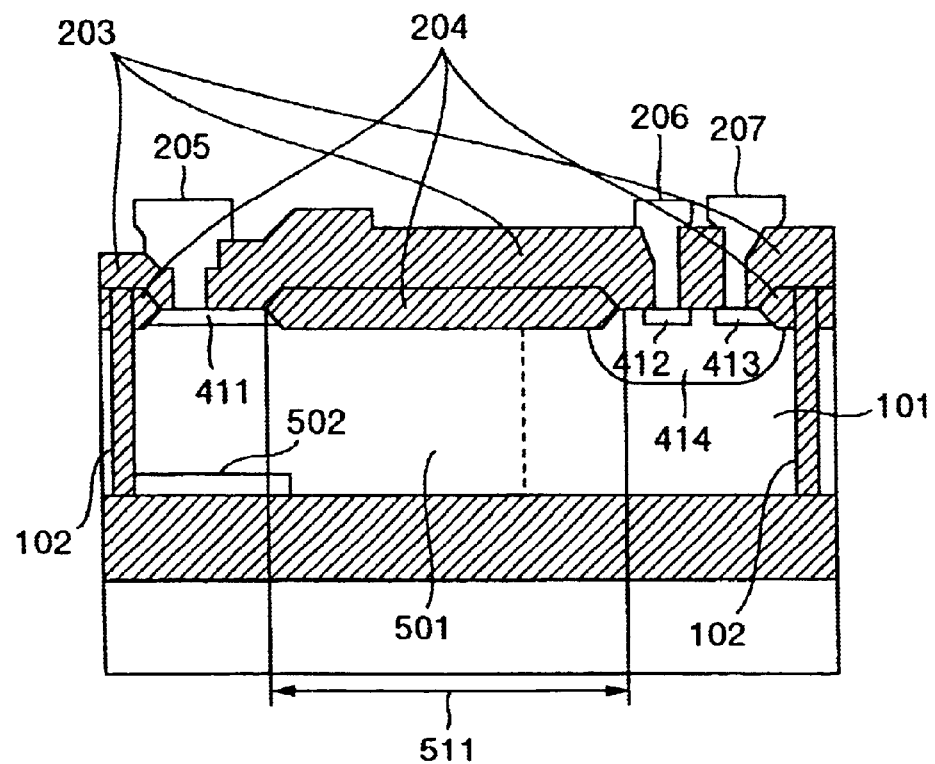

FIGS. 7A and 7B respectively show semiconductor devices according to a fifth embodiment of the present invention. FIG. 7A is a vertical sectional view illustrating the structure of an N-channel MOS field-effect transistor. The N-channel MOS field-effect transistor comprises the source electrode 201, and the drain electrode 202 and the gate electrode 302 disposed in the lateral direction via the field oxide film 204, on the SOI substrate having the N-type device-forming region. The transistor further comprises the gate oxide film 301, high concentration P-type layer 401, high concentration N-type layer 402, high concentration N-type layer 403, and P-type layer or p-body layer 404. The gate oxide film 301 is in contact with the gate electrode 302. The high concentration P-type layer 401 is in contact with the source electrode 201. The high concentration N-type layer 402 is in contact with the source electrode 201 and the gate oxide film 301. The high concentration N-type layer 403 is in contact with the drain electrode 202. The p-body layer 404 is in contact with the high concentration P-type layer 401, high concentration N-type layer 402, and gate oxide film 301. This transistor is characterized in that the N-type layer 501 constitutes a region covering at most 95% of the distance from the end of the field oxide film to the ends of the gate electrode 302 and the gate insulating film 301. The end of the field oxide film is in contact with the high concentration N-type layer 403 contacting the drain electrode 202. The concentration of the N-type layer 501 is higher than the concentration of a drain region contacting the p-body layer. This transistor is also characterized by further comprising the N-type layer 502. The N-type layer 502 is located immediately under the high concentration N-type layer 403 contacting the drain electrode 202, and in contact with the buried oxide film. The concentration of the N-type layer 502 is from $3 \times 10^{16}/cm^3$ to $1 \times 10^{22}/cm^3$.

This embodiment is a combination of the first embodiment and the third embodiment.

In the first embodiment, the concentration of the N-type layer near the buried insulating film immediately under the drain electrode is approximately from $3 \times 10^{15}/cm^3$ to $1 \times 10^{17}/cm^3$. For this reason, in many cases, when a voltage is applied to the drain electrode, the vicinity of the buried oxide film is depleted. Accordingly, as in this embodiment, the concentration of the N-type layer immediately under the drain electrode is set to be from $3 \times 10^{16}/cm^3$ to $1 \times 10^{22}/cm^3$ to prevent depletion. With this arrangement, the vicinity of the buried oxide film immediately under the drain electrode is not depleted, so that the voltage input to the drain electrode is all applied to the buried oxide film. The breakdown voltage of the device is thereby increased.

Further, as shown in FIG. 7B, a combination of the second embodiment and the fourth embodiment is also possible in an NPN bipolar transistor.

Figure 8:
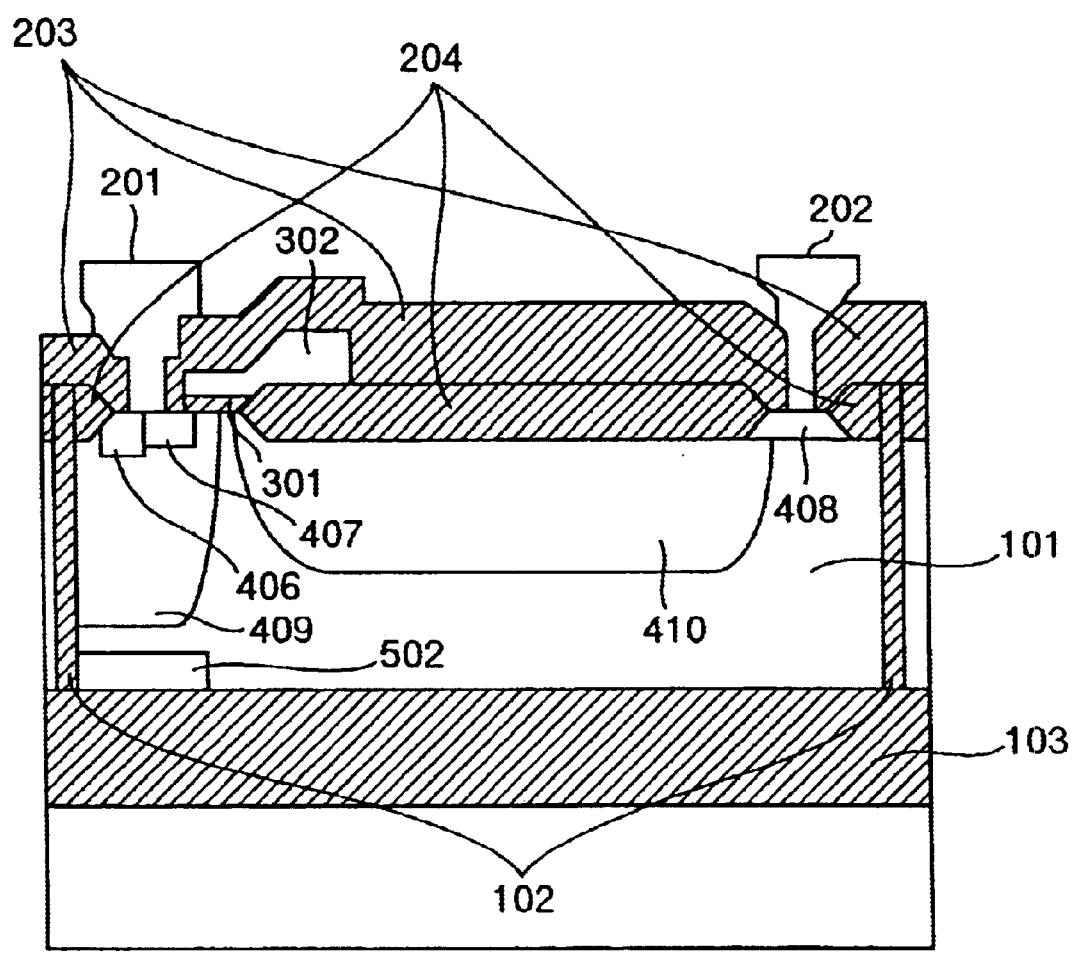
FIG. 8 is a vertical sectional view showing the structure of a P-channel MOS field-effect transistor according to a sixth embodiment of the present invention.

FIG. 8 shows a semiconductor device according to a sixth embodiment of the present invention, and is a vertical sectional view illustrating the structure of a P-channel MOS field-effect transistor. The P-channel MOS field-effect transistor comprises the source electrode 201, and the drain electrode 202 and the gate electrode 302 disposed in the lateral direction via the field oxide film 204, on the SOI substrate 101 having the N-type device-forming region. The transistor further comprises the gate oxide film 301 contacting the gate electrode 302, high concentration N-type layer 406, high concentration P-type layer 407, high concentration P-type layer 408, an N-type layer or n-body layer 409, and a P-type layer 410. The high concentration N-type layer 406 is in contact with the source electrode 201. The high concentration P-type layer 407 is in contact with the source electrode 201 and the gate oxide film 301. The high concentration P-type layer 408 is in contact with the drain electrode 202. The n-body layer 409 is in contact with the high concentration N-type layer 406, high concentration P-type layer 407, and gate oxide film 301. The P-type layer 410 is in contact with the gate oxide film 301, extends toward the drain electrode disposed in the lateral direction, and is in contact with the drain electrode. This transistor is characterized by further comprising an N-type layer. The N-type layer is located immediately under the n-body layer 409 contacting the high concentration N-type layer 406 and the high concentration P-type layer 407, both in contact with the source electrode 201. The concentration of the N-type layer contacting the buried oxide film is from $3 \times 10^{16}/cm^3$ to $1 \times 10^{22}/cm^3$.

In the conventional P-channel MOS field-effect transistor, since a positive voltage is applied to the source electrode, depletion starts from the vicinity of the buried oxide film under the source electrode. Therefore, if the concentration of the N-type layer near the buried oxide film under the source electrode is set to be from $3 \times 10^{16}/cm^3$ to $1 \times 10^{22}/cm^3$ as in this embodiment, depletion does not occur in a region immediately under the source electrode. Accordingly, the voltage input to the source electrode is all applied to the buried oxide film, so that the increased breakdown voltage of the device can be obtained.

Figure 9:
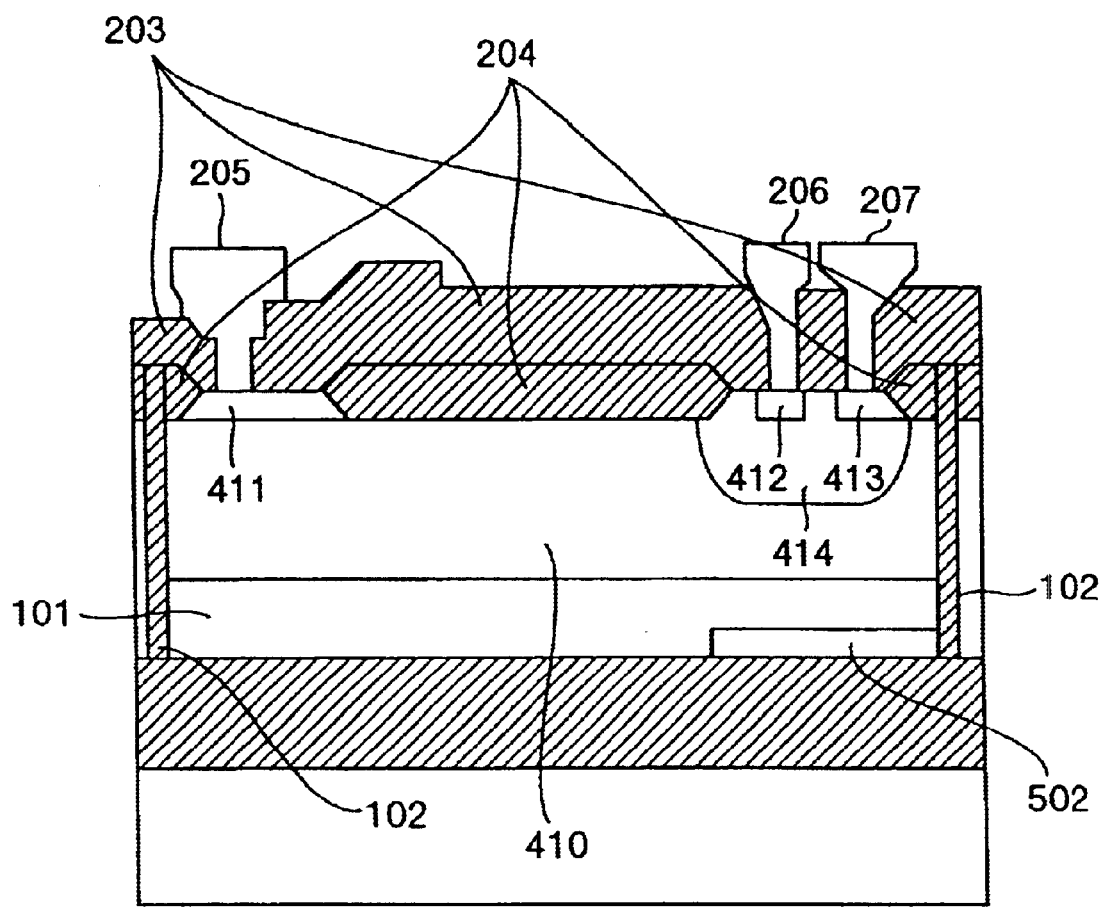
FIG. 9 is a vertical sectional view showing the structure of a PNP bipolar transistor according to a seventh embodiment of the present invention.

FIG. 9 shows a semiconductor device according to a seventh embodiment of the present invention, and is a vertical sectional view illustrating the structure of a PNP bipolar transistor. The PNP bipolar transistor comprises the P-type layer 410 formed in the N-type device-forming region on the SOI substrate 101, the collector electrode 205, and the base electrode 206 and the emitter electrode 207 disposed in the lateral direction via the field oxide film 204. The transistor further comprises the high concentration P-type layer 411, high concentration N-type layer 412, high concentration P-type layer 413, and N-type base layer 414. The high concentration P-type layer 411 is in contact with the collector electrode 201. The high concentration N-type layer 412 is in contact with the base electrode 206. The high concentration P-type layer 413 is in contact with the emitter electrode. The N-type base layer 414 is in contact with the high concentration N-type layer 412 and the high concentration P-type layer 413. This transistor is characterized in that the concentration of a region immediately under the N-type base layer 414, which is in contact with the buried oxide film is from $3 \times 10^{16}/cm^3$ to $1 \times 10^{22}/cm^3$.

In the conventional PNP bipolar transistor, a voltage is applied to the emitter electrode with the base electrode open. Alternatively, voltages are applied to both the emitter electrode and the base electrode. In both cases, depletion starts from the vicinity of the buried oxide film immediately under the N-type base layer 414. For this reason, in order to prevent depletion, the N-type layer having a concentration from $3 \times 10^{16}/cm^3$ to $1 \times 10^{22}/cm^3$ is formed in the vicinity of the buried oxide film immediately under the N-type base layer 414, as in this embodiment. With this arrangement, depletion of this region can be prevented. Thus, the voltage input to the emitter electrode, or the voltages input to both of the emitter electrode and the base electrode are all applied to the buried oxide film, so that the increased breakdown voltage of the device can be obtained.

Figure 10:
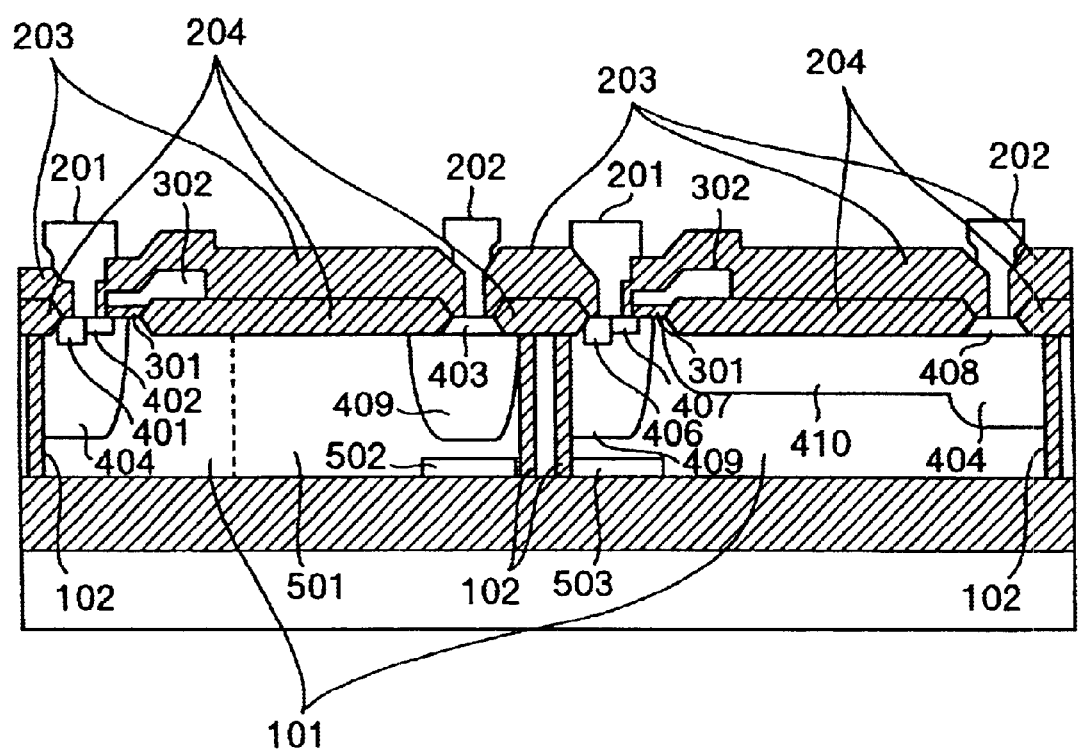
FIG. 10 is a vertical sectional view showing a combination of the N-channel MOS field-effect transistor and the P-channel MOS field-effect transistor according to an eighth embodiment of the present invention.

FIG. 10 is a semiconductor device according to an eighth embodiment of the present invention, and is a vertical sectional view illustrating the structure of a CMOS transistor. This embodiment is a combination of the N-channel MOS field-effect transistor according to the fifth embodiment and the P-channel MOS field-effect transistor according to the sixth embodiment. However, in order to reduce the drain resistances of the N-channel MOS field-effect transistor and the P-channel MOS field-effect transistor, a layer 409 and a layer 404 are added. The layer 409 corresponds to the n-body layer of the P-channel MOS field-effect transistor and is displaced on the underside of the high concentration N-type layer contacting the drain electrode of the N-channel MOS field-effect transistor. The layer 404 corresponds to the p-body layer of the N-channel MOS field-effect transistor, and is disposed on the underside of the high concentration P-type layer contacting the drain electrode of the P-channel MOS field-effect transistor. With these arrangements, the drain resistances of both the N-channel MOS field-effect transistor and the P-channel MOS field-effect transistor are reduced, so that the performance of the MOS transistor is improved, or the on-resistance of the MOS transistor is reduced.

Next, a method of manufacturing the semiconductor device according to the present invention will be described with reference to FIGS. 11 to 14.

Figure 11A:
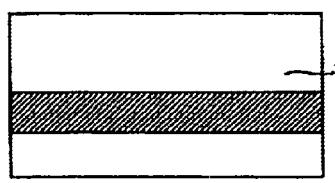
FIGS. 11A to 11I are vertical sectional views showing a method of manufacturing the N-channel MOS field-effect transistor according to the first embodiment of the present invention, step by step.
Figure 11E:
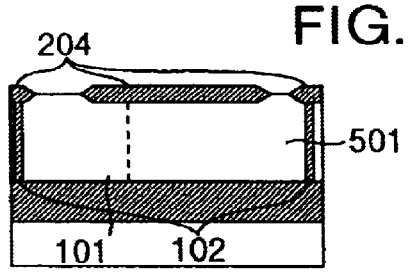
Figure 11B:
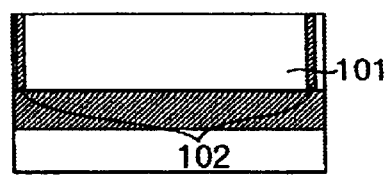
Figure 11F:
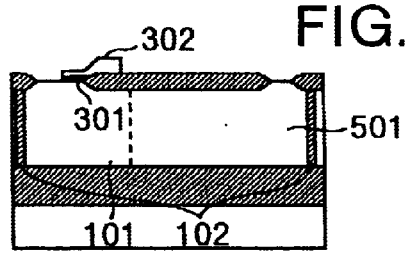
Figure 11C:
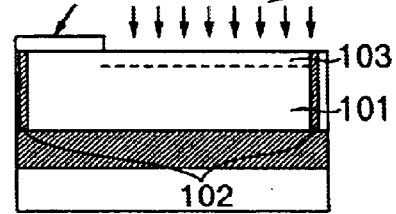
Figure 11G:
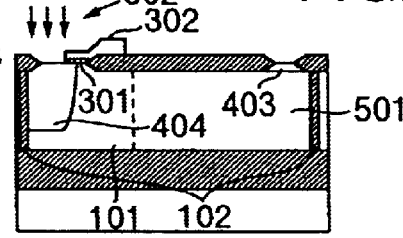
Figure 11D:
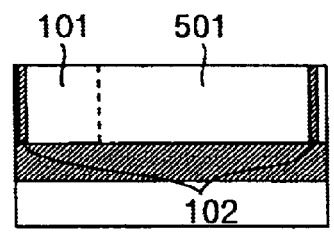
Figure 11H:
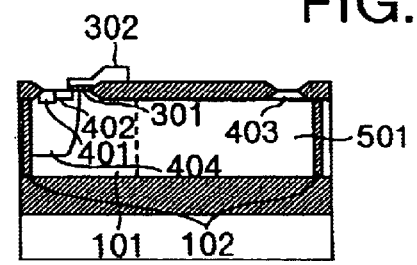
Figure 11I:
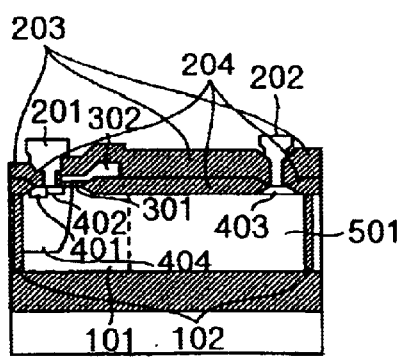

FIGS. 11A to 11I are vertical sectional views showing a method of manufacturing the N-channel MOS field-effect transistor according to the first embodiment of the present invention, step by step. In the SOI substrate 101 having the N-type device-forming region, illustrated in FIG. 11A, trenches as illustrated in FIG. 11B are formed. Then, a film such as a polysilicon film or a silicon oxide film is deposited along the trenches using a CVD method, for example. Trenches 102 covered with the insulating film are thereby formed. Then, a region for which ion implantation is not desired is covered with a photomask 701, as illustrated in FIG. 1C. Thereafter, N-type impurity ions 601 such as phosphorus ions are ion implanted into the SOI substrate to form the N-type layer 103. Then, diffusion of the N-type impurity ions is performed at a temperature from approximately 900° C. to 1200° C. for about several tens to several hundreds of minutes. The N-type region 501 as illustrated in FIG. 11D is thereby formed. Thereafter, as illustrated in FIG. 11E, the field oxide film 204 is formed by a well known art. Subsequently, processes for formation of the gate oxide film 301 and the gate electrode 302 is performed as illustrated in FIG. 11F. Then, P-type impurity ions 602 such as boron ions are ion implanted into a target region as illustrated in FIG. 11G. Then, diffusion of the P-type impurity ions is performed at a temperature from approximately 900° C. to 1200° C. for about several tens to several hundreds of minutes to form the p-body layer 404. Then, P-type impurity ions such as boron ions are ion implanted to form the high concentration P-type layer 401, and N-type impurity ions such as arsenic ions are ion implanted to form the high concentration N-type layers 402 and 403, as illustrated in FIG. 11H. Thereafter, as illustrated in FIG. 11I, deposition of a film such as a silicon oxide film is performed by the CVD method, for example, to form an interlayer insulating film 203. Then, contact holes are formed. Thereafter, a film made of a metal such as aluminum, or tungsten is deposited for processing to form the source electrode 201 and the drain electrode 202. The N-channel MOS field-effect transistor is thereby obtained.

Figure 12A:
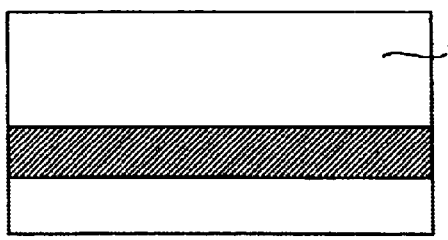
FIGS. 12A to 12H are vertical sectional views showing a method of manufacturing the NPN bipolar transistor according to the second embodiment of the present invention, step by step.
Figure 12B:
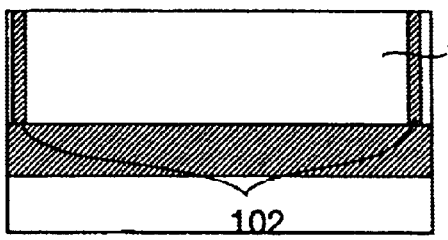
Figure 12C:
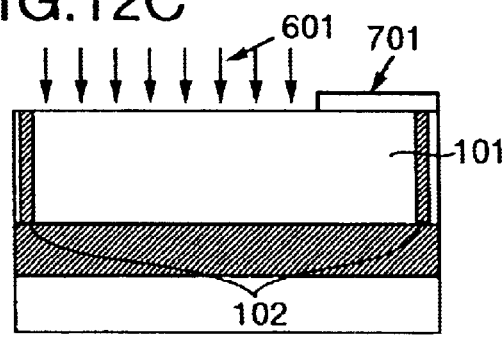
Figure 12D:
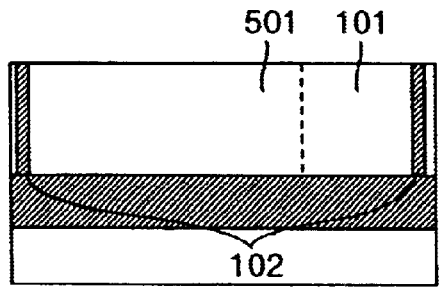
Figure 12E:
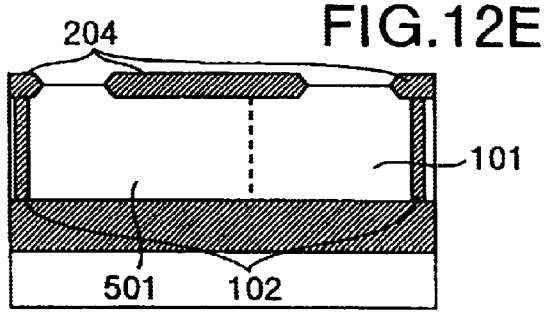
Figure 12F:
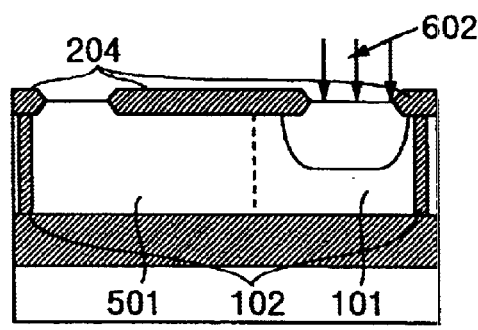
Figure 12G:
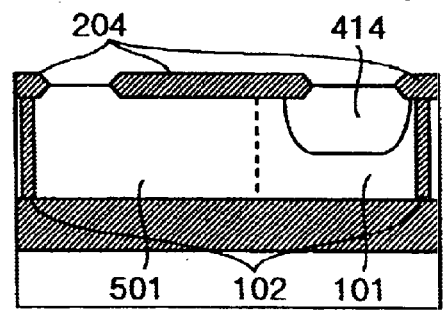
Figure 12H:
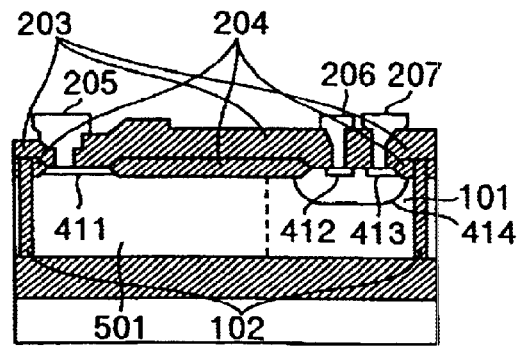

FIGS. 12A to 12H are vertical sectional views showing a method of manufacturing the NPN bipolar transistor according to the second embodiment of the present invention. In the SOI substrate 101 having the N-type device-forming region, illustrated in FIG. 12A, trenches are formed, as illustrated in FIG. 12B. Then, a film such as the polysilicon film or the silicon oxide film is deposited along the trenches by the CVD method, for example. The trenches 102 covered with the insulating film are thereby formed. Then, a region for which ion implantation is not desired is covered with the photomask 701 as illustrated in FIG. 12C. Thereafter, the N-type impurity ions 601 such as phosphorus ions are ion implanted into the SOI substrate to form the N-type layer 103. Then, diffusion of the N-type impurity ions is performed at a temperature from approximately 900° C. to 1200° C. for about several tens to several hundreds of minutes. The N-type region 501 as illustrated in FIG. 12D is thereby formed. Thereafter, as illustrated in FIG. 11E, the field oxide film 204 is formed by the well known art. Then, the P-type impurity ions 602 such as boron ions are ion implanted into a target region as illustrated in FIG. 12F. Then, diffusion of the P-type impurity ions is performed at a temperature from approximately 900° C. to 1200° C. for about several tens to several hundreds of minutes to form the P-type base layer 414 as illustrated in FIG. 12G. Then, the high concentration N-type layers 411 and 413 and the high concentration P-type layer 412 are formed. Thereafter, the interlayer insulating film, contact holes, and metal wiring are formed. Subsequently, the collector electrode 205, base electrode 206, and emitter electrode 207 are formed to obtain the NPN bipolar transistor illustrated in FIG. 12H.

Figure 13A:
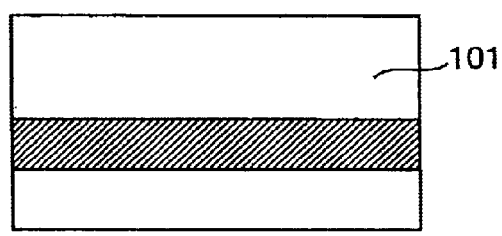
FIGS. 13A to 13H are vertical sectional views showing a method of manufacturing the P-channel MOS field-effect transistor according to the sixth embodiment of the present invention, step by step.
Figure 13B:
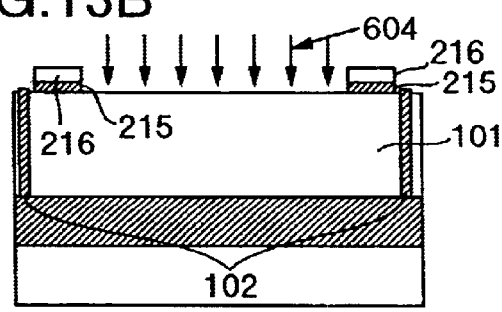
Figure 13C:
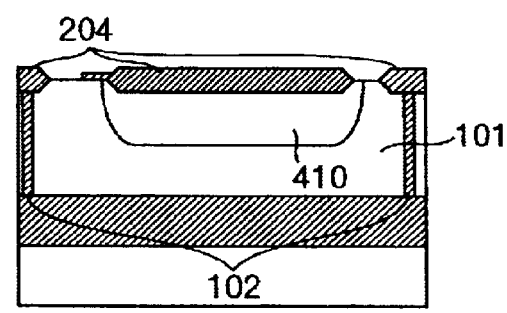
Figure 13D:
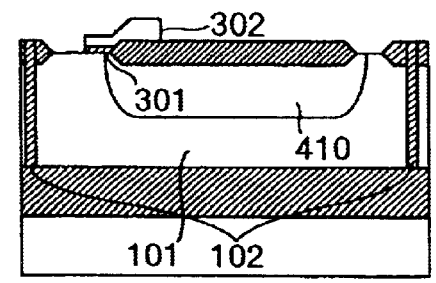
Figure 13E:
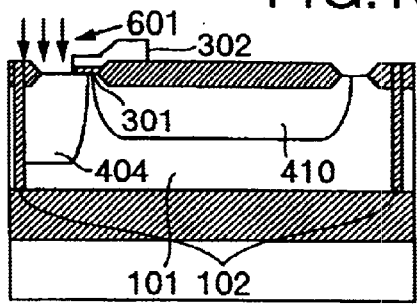
Figure 13F:
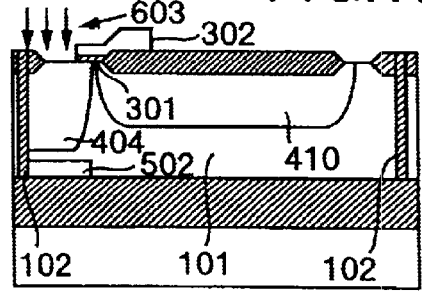
Figure 13G:
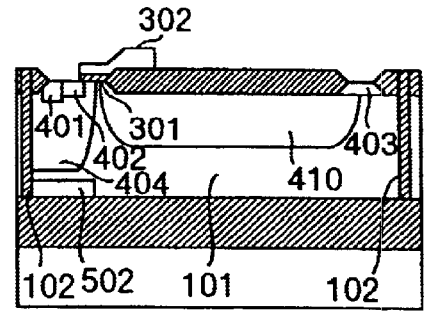
Figure 13H:
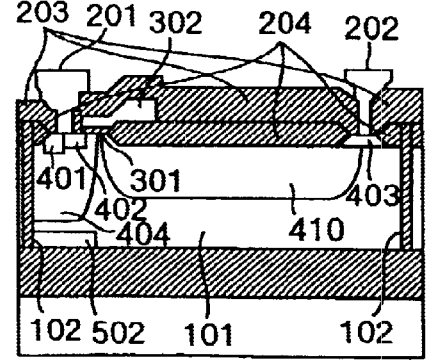

FIGS. 13A to 13H are vertical sectional views showing a method of manufacturing the P-channel MOS field-effect transistor according to the sixth embodiment of the present invention, step by step. In the SOI substrate 101 having the N-type device-forming region, illustrated in FIG. 13A, trenches are formed, as illustrated in FIG. 13B. Then, a film such as the polysilicon film or the silicon oxide film is deposited along the trenches by the CVD method, for example and planarized by a CMP method to obtain the trenches 102 covered with the insulating film. Next, a silicon oxide film 215 and a silicon nitride film 216 are processed to define a device active region, or to make a region covered with the silicon nitride film over the silicon oxide film to become the device active region. Then, P-type impurity ions 604 such as boron ions are ion implanted to form the field oxide film, as illustrated in FIG. 13C. Before an oxidation step, diffusion of the implanted P-type impurity ions is performed at a temperature from approximately 900° C. to 1200° C. for several tens to several hundreds of minutes. As a result of this arrangement, the P-type impurity layer 410, together with the field oxide film 204, is formed. Then, the gate oxide film 301 and the gate electrode 302 are formed as illustrated in FIG. 13D. Then, as illustrated in FIG. 13E, the N-type impurity ions 601 such as phosphorus ions are ion implanted, and then diffused at a temperature from approximately 900° C. to 1200° C. for several tens to several hundreds of minutes to form the n-body layer 404. Then, as illustrated in FIG. 13F, high energy ion implantation of N-type impurity ions such as phosphorus ions having ion energy ranging from several hundreds to several thousands of keV is performed to form the N-type layer 502 such that the concentration of the layer near the buried oxide film is from $3\times10^{16}/cm^3$ to $1\times10^{22}/cm^3$. Then, as illustrated in FIG. 13G, N-type impurity ions such as arsenic ions are ion implanted to form the high concentration N-type layer 401. Further, P-type impurity ions such as boron ions are ion implanted to form the high concentration P-type layers 402 and 403. Subsequently, as illustrated in FIG. 13H, deposition of an insulating film such as the silicon oxide film is performed by the CVD method to form the interlayer insulating film 203. Then, processes for formation of contact holes and metal wiring are performed to form the source electrode 201 and the drain electrode 202. The P-channel MOS field-effect transistor is thereby obtained.

Figure 14A:
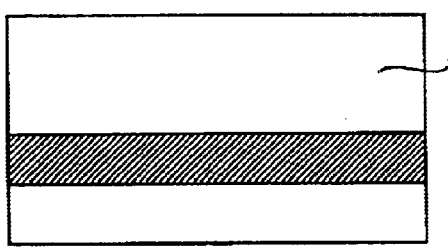
FIGS. 14A to 14H are vertical sectional views showing a method of manufacturing the N-channel MOS field-effect transistor according to the fifth embodiment of the present invention, step by step.
Figure 14B:
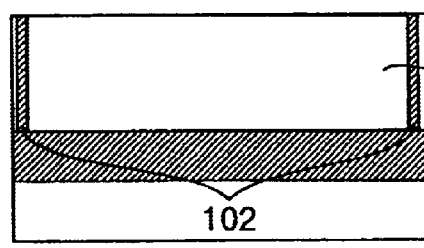
Figure 14C:
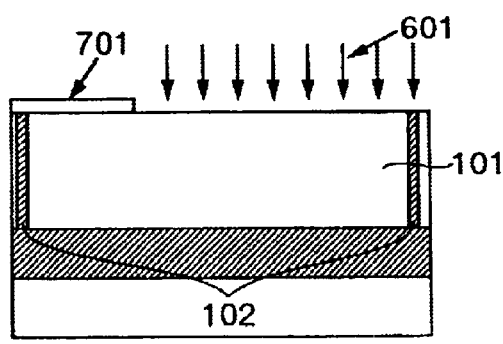
Figure 14D:
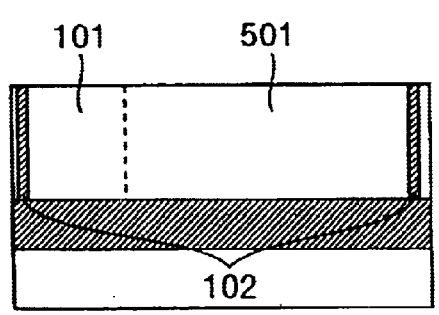
Figure 14E:
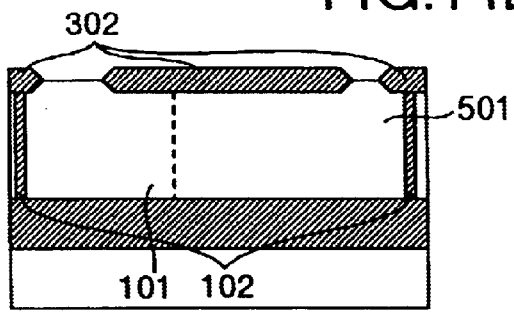
Figure 14F:
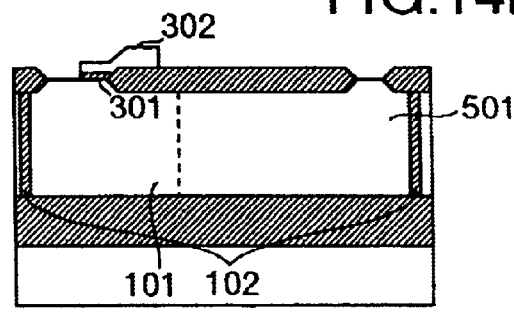
Figure 14G:
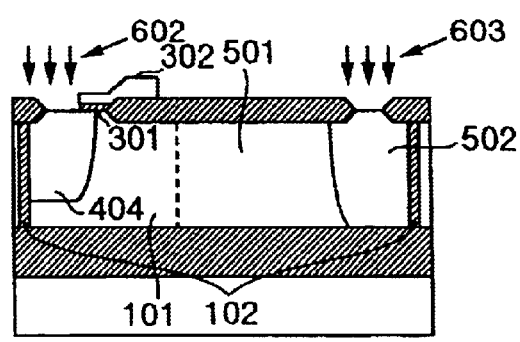
Figure 14H:
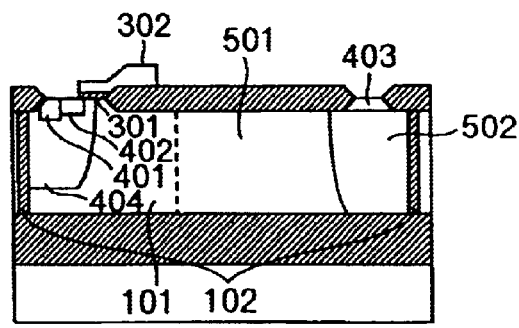

FIGS. 14A to 14H are vertical sectional views showing a method of manufacturing the N-channel MOS field-effect transistor according to the fifth embodiment of the present invention, step by step. In the SOI substrate 101 having the N-type device-forming region, as illustrated in FIG. 14A, trenches as illustrated in FIG. 14B are formed. Then, a film such as the polysilicon film or the silicon oxide film is deposited along the trenches by the CVD method, for example. The trenches 102 covered with the insulating film are thereby formed. Then, a region for which ion implantation is not desired is covered with the photomask 701 as illustrated in FIG. 14C. Thereafter, the N-type impurity ions 601 such as phosphorus ions are ion implanted into the SOI substrate to form the N-type layer 103. Then, diffusion of the N-type impurity ions is performed at a temperature from approximately 900° C. to 1200° C. for about several tens to several hundreds of minutes. The N-type region 501 as illustrated in FIG. 14D is thereby formed. Thereafter, as illustrated in FIG. 14E, the field oxide film 204 is formed by the well known art. Subsequently, the gate oxide film 301 and the gate electrode 302 are formed as illustrated in FIG. 14F. Then, the P-type impurity ions 602 such as boron ions and N-type impurity ions 603 such as phosphor ions are ion implanted, as illustrated in FIG. 14G, and diffused at a temperature from approximately 900° C. to 1200° C. for about several tens to several hundreds of minutes. The p-body layer 404 and the N-type layer 502 are thereby formed. The dose amount, diffusion temperature, and diffusion period of time of the N-type impurity ions are adjusted such that the concentration of the N-type layer 502 in contact with the buried oxide film is from $3\times10^{16}/cm^3$ to $1\times10^{22}/cm^3$. Then, as illustrated in FIG. 11H, P-type impurity ions such as boron ions are ion implanted to form the high concentration P-type layer 401, and impurity ions such as arsenic ions are ion implanted to form the high concentration N-type layers 402 and 403. The N-channel MOS field-effect transistor is thereby obtained.

Figure 15:
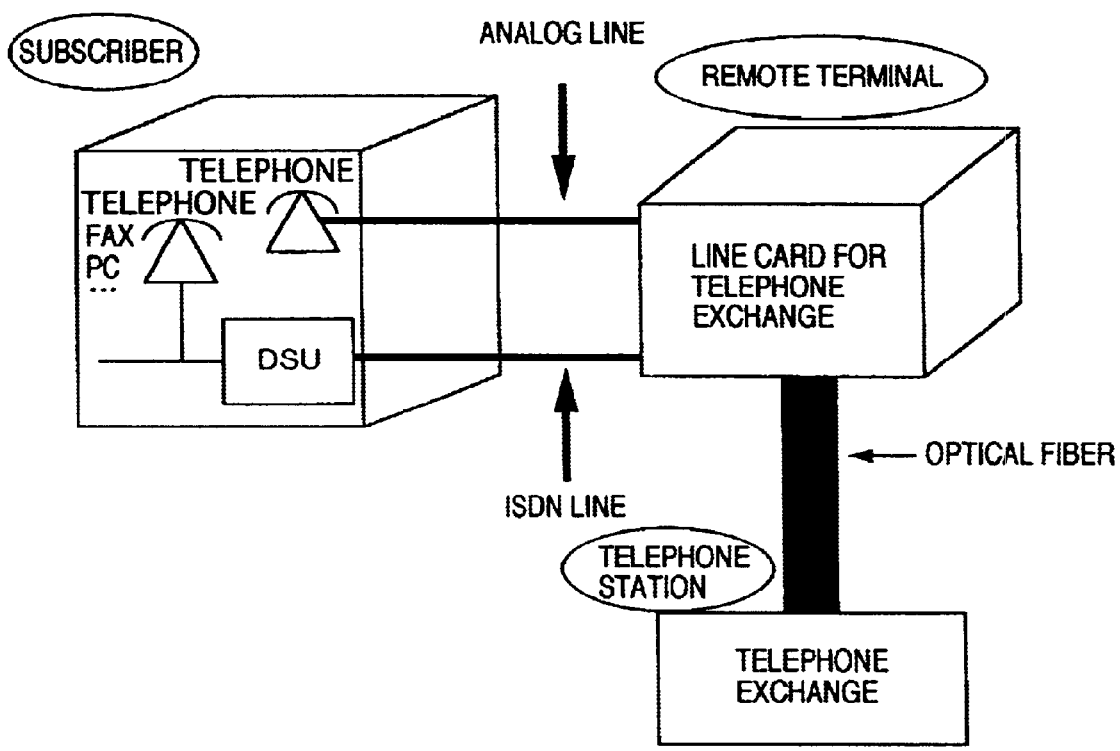
FIG. 15 is a block diagram showing a route from a wired line telephone subscriber to a telephone station by way of an application according to the present invention.

Next, applications of the present invention will be described with reference to FIGS. 15 to 17. FIG. 15 is a block diagram showing a route from a wired line telephone subscriber to a telephone station by way of an example of applications of the N-channel MOS field-effect transistor, P-channel MOS field-effect transistor, NPN bipolar transistor, and PNP bipolar transistor according to the present invention. At present, both of an analog line and a digital line that is an ISDN line are employed as telephone lines. Both of the signals from analog and digital lines are converted to digital signals through a line card for a telephone exchange indicated as a remote terminal in the block diagram, and sent to the telephone exchange installed in the telephone station. Now, an exchange line card IC includes two chips that comprise high breakdown voltage unit and low breakdown voltage unit. MOS transistors or bipolar transistors having a breakdown voltage of 300V or higher are required for the high breakdown voltage unit.

Suppose that the device with the SOI substrate according to the present invention is applied to the high breakdown voltage unit. Then, even if the thickness of the silicon layer in the SOI substrate is 1.5 µm and the thickness of the buried oxide film in the SOI substrate is 3 µm, a device having the breakdown voltage of 300V or higher can be manufactured. The exchange line card IC can be thereby implemented on a single chip. An 8-inch wafer with 1.5-µm thick silicon layer and the 3-µm thick buried oxide film is available even now. Thus, lower chip cost can also be achieved.

Figure 16A:
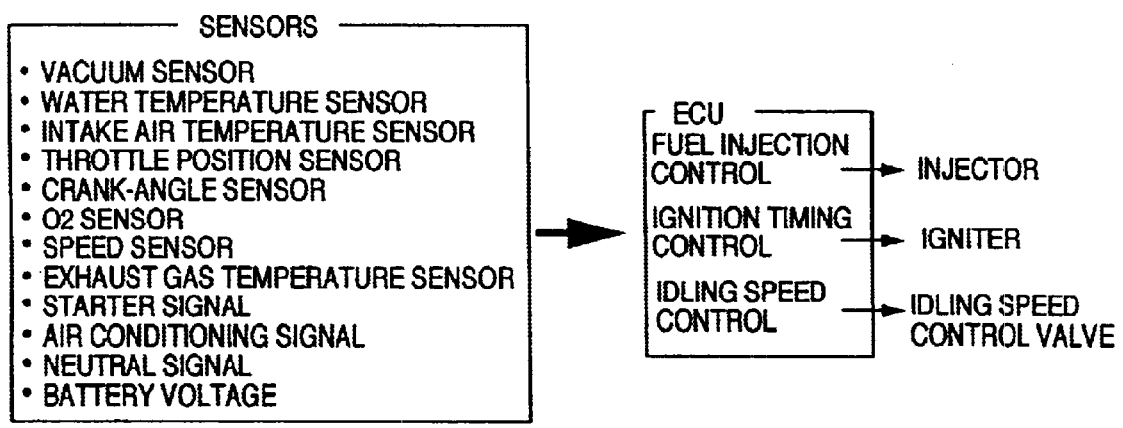
FIGS. 16A and 16B are block diagrams respectively showing an automobile engine control system and an automobile ABS (Anti-lock Brake System) by way of an application according to the present invention.
Figure 16B:
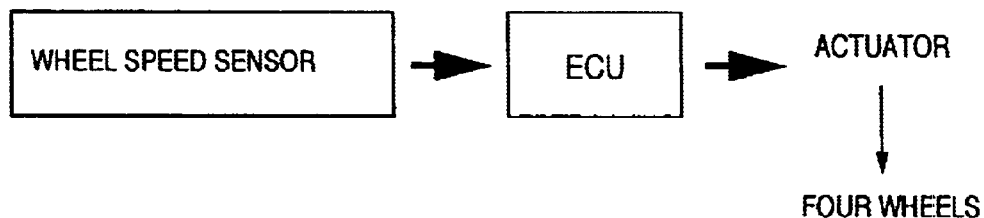

FIG. 16A is a block diagram showing an automobile engine control system by way of an example of applications of the N-channel MOS field-effect transistor, P-channel MOS field-effect transistor, NPN bipolar transistor, and PNP bipolar transistor according to the present invention. The condition of an engine is detected by means of various sensor signals. Then, ECU (Engine Control Units) intensively performs a plurality of controls such as fuel injection control, ignition timing control and idle rotational speed control, thereby causing the engine to be operated in optimum conditions. FIG. 16B is a block diagram of an ABS (Anti-lock Brake System). Upon reception of a signal indicating a wheel speed from a wheel speed sensor, the ECU sends to an actuator an appropriate control signal according to the wheel speed and a road surface. The actuator controls brake hydraulics in each wheel cylinder in response to the control signal from the ECU.

Generally, the ECU is a power IC that comprises MOS transistors or bipolar transistors with a high breakdown voltage and MOS transistors with a low breakdown voltage. The breakdown voltage of this power IC is from 40 V to 60 V in a current 14 V power system. In a 42 V power system the introduction of which is scheduled around the year 2003, the breakdown voltage will become approximately from 80 V to 100 V.

By applying the structure according to the present invention to the high breakdown voltage device, the silicon layer and the buried oxide film in the SOI substrate can be made thinner. Thus throughput is improved, and cost reduction can be thereby achieved.

Figure 17:
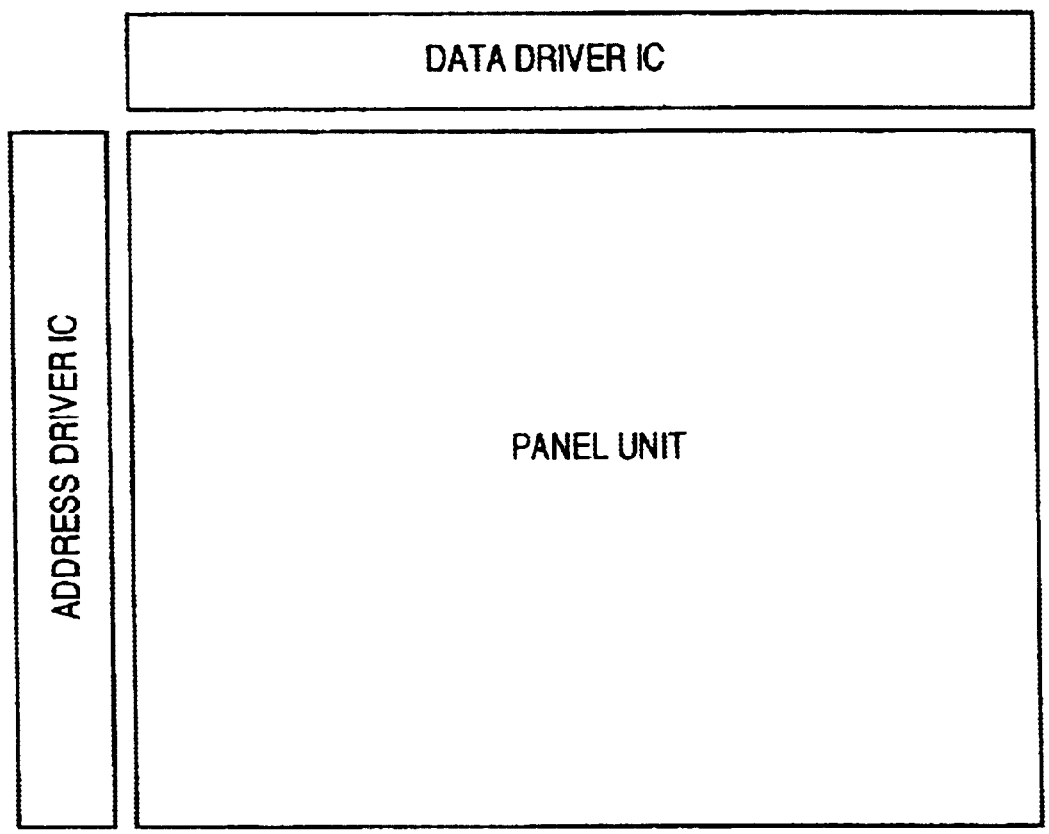
FIG. 17 is a block diagram showing a PDP (Plasma Display Panel) by way of an application according to the present invention.

FIG. 17 is a block diagram showing a PDP (Plasma Display Panel) by way of an example of applications of the N-channel MOS field-effect transistor, P-channel MOS field-effect transistor, NPN bipolar transistor, and PNP bipolar transistor according to the present invention. Driver ICs for illuminating the panel are disposed so as to surround a panel unit. In general, the driver ICs are classified into two types: address driver ICs and data driver ICs. The breakdown voltage required for the address driver IC is approximately 200 V or higher, while the breakdown voltage required for the data driver IC is approximately 100 V or higher.

Suppose that the device having the structure according to the present invention is applied to the high breakdown voltage device unit of the driver IC. Then, the address driver IC having the breakdown voltage of 200 V or higher, with the thickness of the silicon layer of 1.5 µm and the thickness of the buried oxide film of 2.0 µm, for example, can be manufactured. Manufacture of a wafer having a large diameter is thereby facilitated, so that cost reduction can be achieved. Further, the data driver IC having the breakdown voltage of 100 V or higher, with the thickness of the silicon layer of 1.5 µm and the thickness of the buried oxide film of 0.5 µm can also be manufactured. Manufacture of a wafer having a large diameter is thereby facilitated, so that cost reduction can be achieved.

It should be further understood by those skilled in the art that the foregoing description has been made on embodiments of the invention and that various changes and modifications may be made in the invention without departing from the spirit of the invention and the scope of the appended claims.

What is claimed is:

1. A PDP (Plane Display Panel) driver IC incorporating at least one semiconductor device comprising an N-channel insulated-gate field-effect transistor on an SOI (Silicon On Insulator) substrate having an N-type device-deforming region, the N-channel insulated-gate field-effect transistor including high concentration N-type and P-type layers both in contact with a source electrode, a gate insulating film/gate electrode in contact with the high concentration N-type layer, a high concentration N-type layer in contact with a drain electrode disposed in a lateral direction via a field oxide film contacting the gate electrode, and a p-type semiconductor layer (p-body layer) contacting the gate oxide film and the high concentration N-type and P-type layers both in contact with the source electrode, wherein, when a distance from an end of the field oxide film contacting the high concentration N-type layer in contact with the drain electrode to ends of the gate electrode and the gate oxide film both in contact with the high concentration N-type layer contacting the source electrode is defined as a source-drain distance, the N-channel insulated-gate field-effect transistor further comprises;

an N-type layer having a concentration higher than a concentration of an N-type layer in contact with the p-body layer, formed in a region covering at most 95% of the source-drain distance between the p-body layer and the drain electrode in the silicon substrate over an interface of a buried oxide film, the silicon substrate being in contact with both the field oxide film and the high concentration N-type layer contacting the drain electrode.

2. A semiconductor device for illumination-driving a plasma display panel, wherein:

the semiconductor device is an address driving semiconductor device for driving an address of said plasma display panel;

a rated breakdown voltage of the address driving semiconductor device is higher than 200 volts;

the address driving semiconductor device is provided with an N-channel insulated-gate field-effect transistor on an N-type SOI (Silicon On Insulator), the N-channel insulated-gate field-effect transistor including high concentrated N-type and P-type layers both in contact with a source electrode, a gate insulating film/gate electrode in contact with the high concentration N-type layer a high concentration N-type layer in contact with a drain electrode disposed in a lateral direction via a field oxide film contacting the gate electrode, and a P-type semiconductor layer (p-body layer) contacting the gate oxide film and the high concentration N-type and P-type layers both in contact with the source electrode; and between the p-body layer and the drain electrode over an interface of a buried oxide film in the silicon substrate being in contact with both the field oxide film and the high concentration N-type layer contacting the drain electrode of the N-channel insulated-gate field-effect transistor, an N-type layer having a concentration higher than a concentration of the N-type layer in contact with the p-body layer exists in a region covering at most 95% or a source-drain distance that is a distance from an end of the field oxide film contacting the high concentration N-type layer in contact with the drain electrode to ends of the gate electrode end the gate oxide film both in contact with the high concentration N-type layer contacting the source electrode.

3. A semiconductor device for illumination-driving a plasma display panel, wherein:

the semiconductor device is an address driving semiconductor device for driving an address of said plasma display panel;

a rated breakdown voltage of the address driving semiconductor device is higher than 200 volts;

the address driving semiconductor device is provided with an NPN bipolar transistor on an N-type SOI substrate, the NPN bipolar transistor including a collector electrode, an emitter electrode and a base electrode bath disposed via a field oxide film, a high concentration N-type layer in contact with the collector electrode, a high concentration N-type layer in contact with the emitter electrode, a high concentration P-type layer in contact with the base electrode, and a P-type base region in contact with the high concentration N-type layer contacting the emitter electrode and the high concentration P-type layer contacting the base electrode; and between the P-type base region and the collector electrode over an interface of a buried oxide film in the silicon substrate being in contact with both the field oxide film end the high concentration N-type layer contacting the collector electrode of the NPN bipolar transistor, an N-type layer having a concentration higher than a concentration of the N-type layer in contact with the P-type base region exists in a region covering at most 95% of a collector-base distance that is a distance from an end of the field oxide film contacting the high concentration N-type layer in contact with the collector electrode to an end of the field oxide film in contact with the P-type base region.

4. A semiconductor device for illumination-driving a plasma display panel, wherein:

the semiconductor device is an address driving semiconductor device for driving an address of said plasma display panel;

a rated breakdown voltage of the address driving semiconductor device is higher than 200 volts;

the address driving semiconductor device is provided with a P-channel insulated-gate field-effect transistor on en N-type SOI substrate, the P-channel insulated-gate field-effect transistor including high concentrated N-type and P-type layers both in contact with a source electrode, a gate insulating film/gate electrode in contact with the high concentration P-type layer, a high concentration P-type layer in contact with a drain electrode disposed in a lateral direction via a field oxide film contacting the gate electrode, an N-type semiconductor layer (n-body layer) contacting the gate oxide film and the high concentration N-type and P-type layers both in contact with the source electrode, and a P-type layer contacting the gate oxide film and extending under the field oxide film toward the drain electrode to be contact with the drain electrode; and an N-type layer wholly in contact with a buried oxide film, immediately under the n-body layer has a concentration from $3\times10^{16}/cm^3$ to $1\times10^{22}/cm^3$.

5. A semiconductor device for illumination driving a plasma display panel, wherein:

the semiconductor device is an address driving semiconductor device for dying an address of said plasma display panel;

a rated breakdown voltage of the address driving semiconductor device is higher than 200 volts;

the address driving semiconductor device is provided with a PNP bipolar transistor on an N-type SOI substrate, the PNP bipolar transistor including a 2-type layer formed in the device-forming region without contacting a buried oxide film, a collector electrode, an emitter electrode and a base electrode both disposed via a field oxide film, a high concentration P-type layer in contact with the collector electrode, a high concentration P-type layer in contact with the emitter electrode, a high concentration N-type layer in contact with the base electrode and an N-type base region contacting the high concentration P-type layer in contact with the base electrode and the high concentration N-type layer in contact with the base electrode; and an N-type layer wholly in contact with the buried oxide film, immediately under the N-type base region has a concentration from $3\times10^{16}/cm^3$ to $1\times10^{22}/cm^3$.

* * * * *